(12) United States Patent
Miu et al.

(10) Patent No.: US 6,262,463 B1
(45) Date of Patent: Jul. 17, 2001

(54) MICROMACHINED ACCELERATION ACTIVATED MECHANICAL SWITCH AND ELECTROMAGNETIC SENSOR

(75) Inventors: Denny K. Miu, Valencia; Weilong Tang, Alhambra, both of CA (US)

(73) Assignee: Integrated Micromachines, Inc., Monrovia, CA (US)

( * ) Notice: Subject to any disclaimer, the term of this patent is extended or adjusted under 35 U.S.C. 154(b) by 0 days.

(21) Appl. No.: 09/349,840

(22) Filed: Jul. 8, 1999

(51) Int. Cl.$^7$ .......................... H01L 27/14; H01L 29/82; H01L 29/84
(52) U.S. Cl. ...................... 257/414; 257/415; 200/83 N; 200/83 V; 335/78; 335/80; 361/819; 438/50
(58) Field of Search ................................... 257/414, 415; 200/83 N, 83 V; 335/78, 80; 361/819; 438/50

(56) References Cited

U.S. PATENT DOCUMENTS

| | | |
|---|---|---|
| 4,429,349 | 1/1984 | Zachry . |
| 4,581,624 | * 4/1986 | O'Connor ............................. 357/26 |
| 4,826,131 | 5/1989 | Mikkor . |
| 5,025,346 | 6/1991 | Tang et al. . |
| 5,153,543 | 10/1992 | Hitachi et al. . |
| 5,194,402 | * 3/1993 | Ehrfeld et al. ....................... 437/180 |
| 5,374,792 | 12/1994 | Ghezzo et al. . |
| 5,398,011 | 3/1995 | Kimura et al. . |
| 5,472,539 | 12/1995 | Saia et al. . |
| 5,475,353 | 12/1995 | Roshen et al. . |
| 5,557,132 | * 9/1996 | Takahashi ............................ 257/415 |
| 5,627,396 | * 5/1997 | James et al. ......................... 257/415 |

FOREIGN PATENT DOCUMENTS

| | | |
|---|---|---|
| 0 573 267 A1 | 12/1993 | (EP) . |
| 0 685 864 A1 | 12/1995 | (EP) . |
| 2 215 914 | 9/1989 | (GB) . |
| 355024485 | * 2/1980 | (JP) . |
| 02021414 | 1/1990 | (JP) . |
| 02141912 | 5/1990 | (JP) . |

OTHER PUBLICATIONS

Ahn, Et Al., "A Fully Integrated Micromagnetic Actuator With A Multilevel Meander Magnetic Core," IEEE, p. 14–18, (1992).

Coughlin Et Al., "Design Trends In Head/Gimbal Assemblies For Hard–Disk Drives," Data Storage, p. 23–31, (May/Jun. 1995).

(List continued on next page.)

*Primary Examiner*—William Mintel
(74) *Attorney, Agent, or Firm*—Bever, Hoffman & Harms, LLP; E. Eric Hoffman

(57) ABSTRACT

A micro-sensor having have a flexible monocrystalline structure that is moved by an external force. In one embodiment, one or more pole tips are mounted on the monocrystalline structure. The monocrystalline structure is suspended over one or more planar coils such that each pole tip is suspended over a corresponding planar coil. As the monocrystalline structure moves in response to the external force, the pole tips are moved in the coils, thereby changing the inductance or inducing a voltage in the coils. In another variation, a micro-switch includes a lower structural member having a pattern of raised spacer pads that laterally surround a plurality of contact pads. The lower structural member is joined to an upper structural member that includes a frame, a platform located in the frame and a plurality of spring elements which connect the frame to the platform. The upper structural member has a conductive layer formed on its planar lower surface. The lower surface of the frame is affixed to the spacer pads, such that the platform is suspended over the contact pads. An external force applied to the resulting structure causes the spring elements to flex, such that the platform moves toward the lower structural member, thereby placing the conductive layer into contact with the contact pads of the lower structural member.

16 Claims, 28 Drawing Sheets

OTHER PUBLICATIONS

Temesvary Et Al., "Design, Fabrication, And Testing Of Silicon Microgimbals . . . ," IEEE, ;. 18–27, (1995).

Yao Et Al., "A Surface Micromachined Miniature Switch For Telecommunications . . . ," The 8th Int'l Conference On Solid–State Sensors . . . , p. 384–387, (Jun. 25–29, 1995).

Drake Et Al., "An Electrostatically Actuated Micro–Relay," Transducers '95 Eurosensors IX, 329–B 10, 4 pages.

Hosaka Et Al., "Electromagnetic Microrelays: Concepts And Fundamental Characteristics," Sensors and Actuators, A. 40 (1994), p. 41–47.

Miu, "Silicon Microactuators For Rigid Disk Drives," Data Storage, (Jul./Aug. 1995), p. 33–40.

Miu Et Al., "Silicon Microgimbals For Super–Compact Magnetic Recording Rigid Disk Drives," ISSN, (1993), p. 139–152.

Miu Et Al., "Silicon Micromachined Scaled Technology," IEEE, (1995), p. 234–239.

Miu Et Al., "Silicon Microstructures and Microactuators For Compact Computer Disk Drives," IEEE, (1994), p. 52–57.

O'Connor, "Miniature Motors For Future PCs," Mechanical Engineering, (Feb. 1995), p. 63–65.

Tang Et Al., "Silicon Micromachined Electromagnetic Microactuators For Rigid Disk Drives," 1995 Intermag Conference, p. 1–3.

* cited by examiner

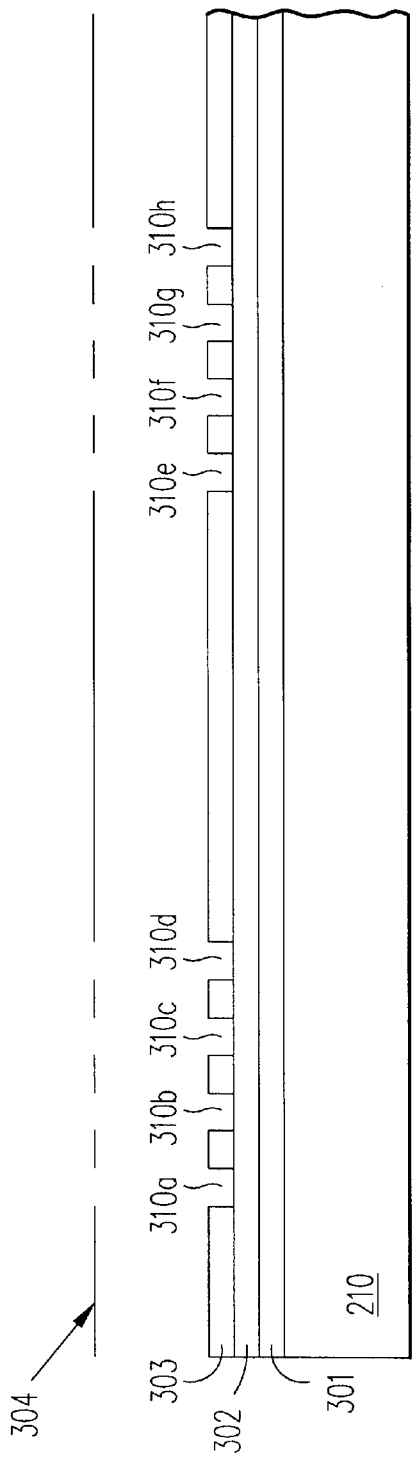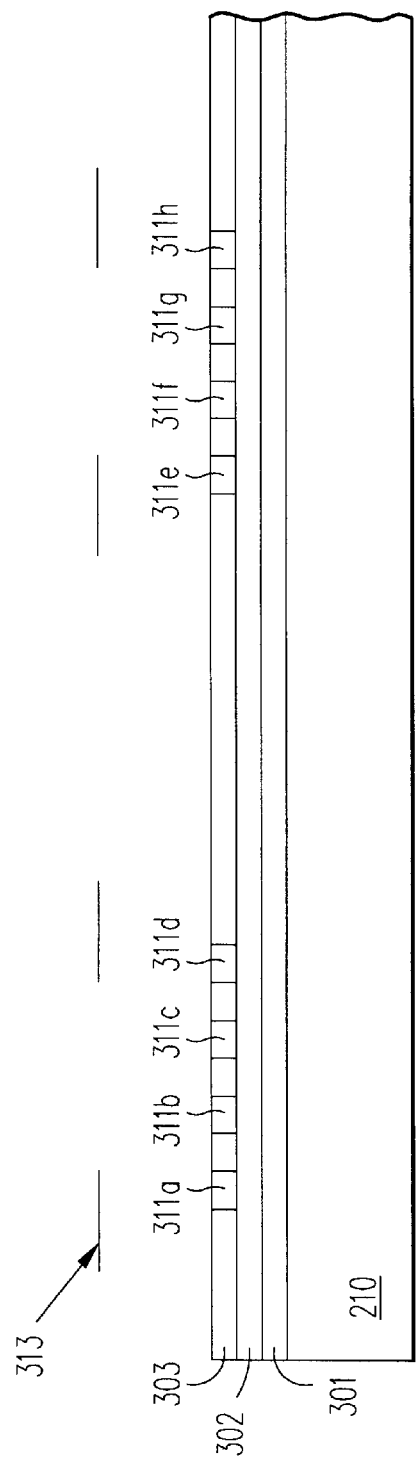
FIG. 8a
FIG. 8b

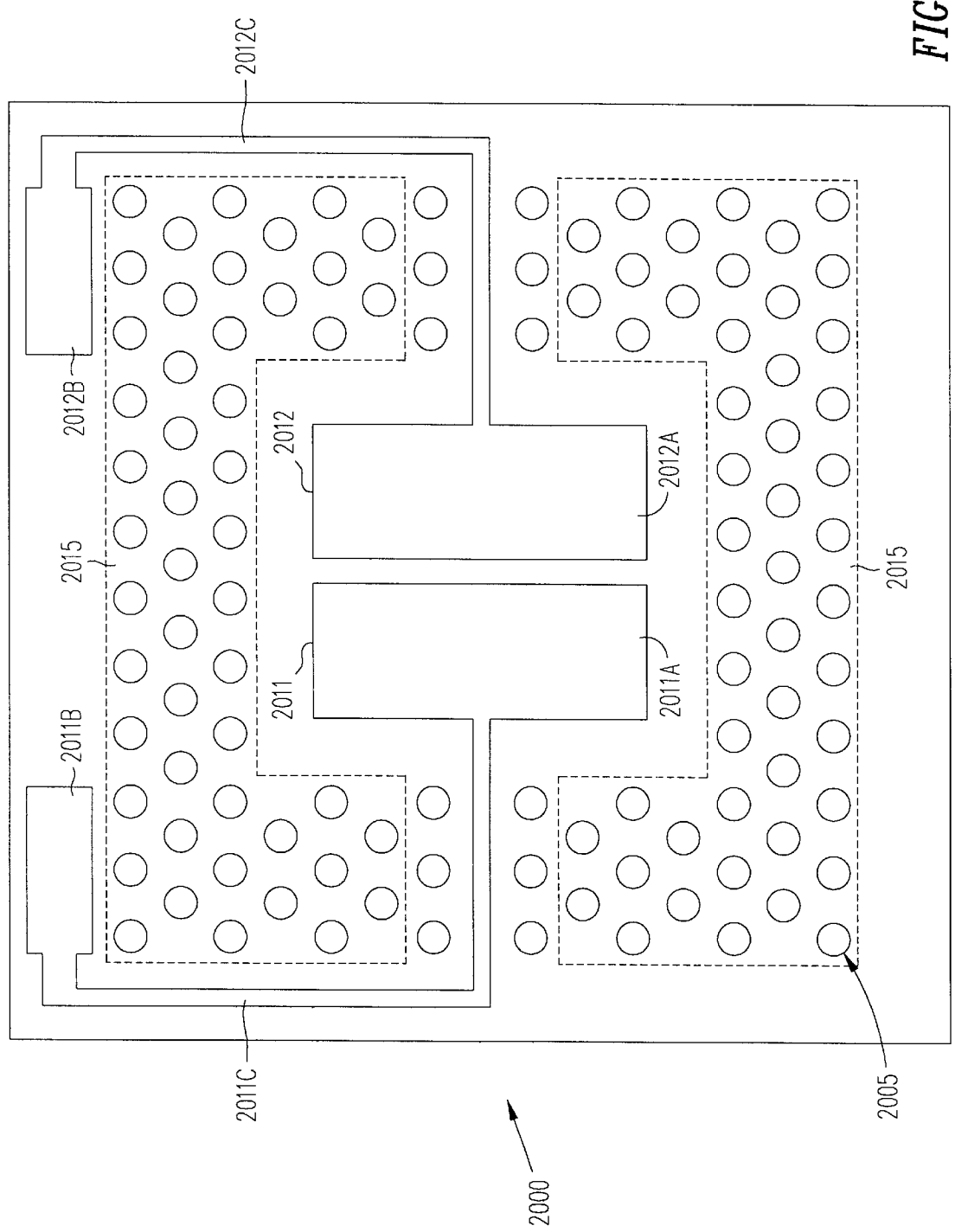

MICROMACHINED ACCELERATION ACTIVATED MECHANICAL SWITCH AND ELECTROMAGNETIC SENSOR

FIELD OF USE

The present invention relates to a micro-machined switch (micro-switch) and a micro-machined sensor (micro-sensor) which performs mechanical switching or signaling in response to an externally applied acceleration force. This invention also relates to techniques for fabricating such a micro-switch or micro-sensor.

BACKGROUND ART

Many industrial applications require force-actuated mechanical switches. Such mechanical switches provide reliable isolation when in an open state, and provide a low resistance electrical path when in a closed state. However, conventional force-actuated mechanical switches are relatively large and have relatively slow switching speeds. Moreover, conventional force-actuated mechanical switches are typically difficult and costly to fabricate. In addition, it may be difficult to control the sensitivity of force-actuated mechanical switches.

One application of a force-actuated mechanical switch is as a safety switch to avoid accidental deployment of air bags (i.e., air bag switches). In this case, the air bag switch is mounted in an automobile. The air bag switch remains in an open state when the external force applied to the air bag switch is less than a threshold, which is usually, characterized in g's. (A "g" is defined as a force resulting from an acceleration of 9.8 meters/second$^2$.) When the external force applied to the air bag switch is greater than a predetermined threshold (e.g., when the automobile is in a head on collision) the air bag switch is forced into a closed state, thereby allowing deployment of the air bag.

Force-activated mechanical switches or sensors are also used as shock sensors in computer disk drives. In the case of rigid disk drives, when the mechanical shock or vibration imposed by the environment is excessive, the drive electronics must be able to detect such a disturbance and turn off the read/write circuits in order to avoid overwrite errors. Conventional shock sensors typically use a cantilever beam, which deflects in the presence of external forces. These shock sensors sense the deflection by means of stress imposed on laminated piezopolymeric films or piezoresistive strain gages. Alternatively, these shock sensors can sense the deflection by monitoring the changes in capacitance between the beam and the ground plane.

Similarly, in many other applications, it is desirable to have an analog sensor that outputs a continuous signal proportional to acceleration.

It would therefore be desirable to have a force-activated mechanical switch or sensor which has reliable sensitivity, durability, fatigue and deformation characteristics, has accurate (or linear) operating characteristics, and which can be fabricated at low cost and with batch manufacturing processes.

SUMMARY

Accordingly, the present invention provides a micro-switch and micro-sensor that use a monocrystalline material, such as monocrystalline silicon, as the structural material. Monocrystalline silicon has advantageous stiffness, durability, fatigue and deformation characteristics. The silicon is moved by externally applied forces to provide an electrical connection between contact elements or to output an analog signal.

In one embodiment, the micro-sensor includes an upper structural member and a lower structural member. The lower structural member includes a substrate and one or more planar coils are fabricated on the upper surface of the lower structural member. The substrate can be, for example, a semiconductor material such as monocrystalline silicon.

The upper structural member includes a monocrystalline substrate. The monocrystalline substrate can be, for example, a semiconductor material such as monocrystalline silicon. The monocrystalline substrate is fabricated to form a frame, a platform that is laterally surrounded by the frame, and a plurality of spring elements, which flexibly connect the frame to the platform. In a particular embodiment, the spring elements have a serpentine shape. The monocrystalline substrate has a planar lower surface, and a pole tip is located on the lower surface of the platform portion of the substrate.

The upper structural member is connected to the lower structural member to form the micro-sensor. More specifically, the frame of the upper structural member is connected to the lower structural member. As a result, the pole tip is suspended over the coil of the lower structural member. When an external force is applied to the resulting structure, the spring elements flex to allow the platform to move toward the lower structural member. When the external force becomes sufficiently large, the platform will deflect to move the pole tip into the planar coil. The thickness and geometry of the platform and spring elements can be selected to provide the desired operating characteristics for the micro-sensor. The pole tip can be made of a ferromagnetic material or a permanent magnetic material. A ferromagnetic pole tip will change the measured inductance of the coil as the pole tip moves in the coil. A permanent magnetic pole tip will induce a voltage in the coil as the pole tip moves in the coil. The inductance or voltage of the coil is therefore monitored to determine whether the pole tip, and therefore the platform, is moving in response to an external force.

In another embodiment, a micro-switch includes a lower structural member and an upper structural member. The lower structural member includes a substrate, a plurality of electrically conductive contact pads located on the upper surface of the substrate, and a plurality of raised spacer pads formed on the upper surface of the substrate. The substrate can be, for example, a semiconductor material such as monocrystalline silicon.

In this embodiment, the upper structural member includes a monocrystalline substrate having a planar lower surface, and an electrically conductive bridge contact pad located on the lower surface of the substrate. The monocrystalline substrate can be, for example, a semiconductor material such as monocrystalline silicon. The monocrystalline substrate is fabricated to form a frame, a platform that is laterally surrounded by the frame, and a plurality of spring elements, which flexibly connect the frame to the platform. In a particular embodiment, the spring elements have a serpentine shape. In one embodiment, the frame and platform have a thickness of approximately 500 μm, while the spring elements have a thickness of approximately 6 μm.

The upper structural member is connected to the lower structural member to form the micro-switch. More specifically, the frame of the upper structural member is connected to the raised spacer pads of the lower structural member. As a result, the bridge contact pad is suspended over the contact pads of the lower structural member. The spacing between the bridge contact pad and the contact pads of the lower structural member are determined by the height of the spacer pads formed on the lower structural member.

When an external force is applied to the resulting structure, the spring elements flex to allow the platform to move toward the lower structural member. When the external force becomes sufficiently large, the platform will deflect to move the bridge contact pad into electrical contact with the contact pads of the lower structural member. The thickness and geometry of the platform and spring elements can be selected to provide the desired operating characteristics for the micro-switch.

The present invention will be more fully understood in light of the following detailed description taken together with the drawings.

BRIEF DESCRIPTION OF THE DRAWINGS

FIGS. 8a–8h are cross sectional views illustrating the fabrication of the lower structural member of FIGS. 3 and 4 in accordance with one embodiment of the invention;

FIG. 20 is a top view of a lower structural member in accordance with another embodiment of the present invention;

DETAILED DESCRIPTION

Figure 1:
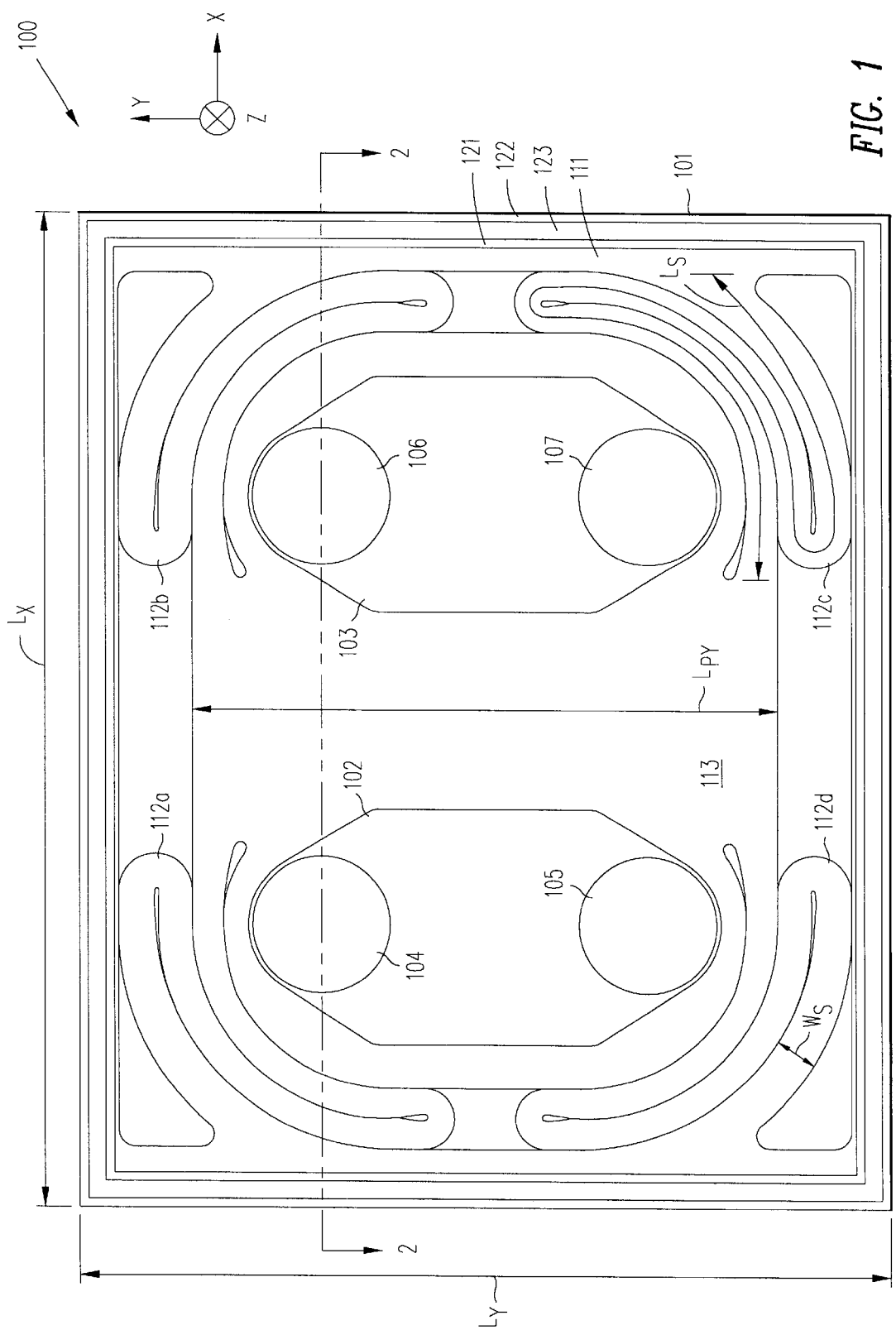
FIG. 1 is a bottom view of an upper structural member in accordance with one embodiment of the invention.
Figure 2:
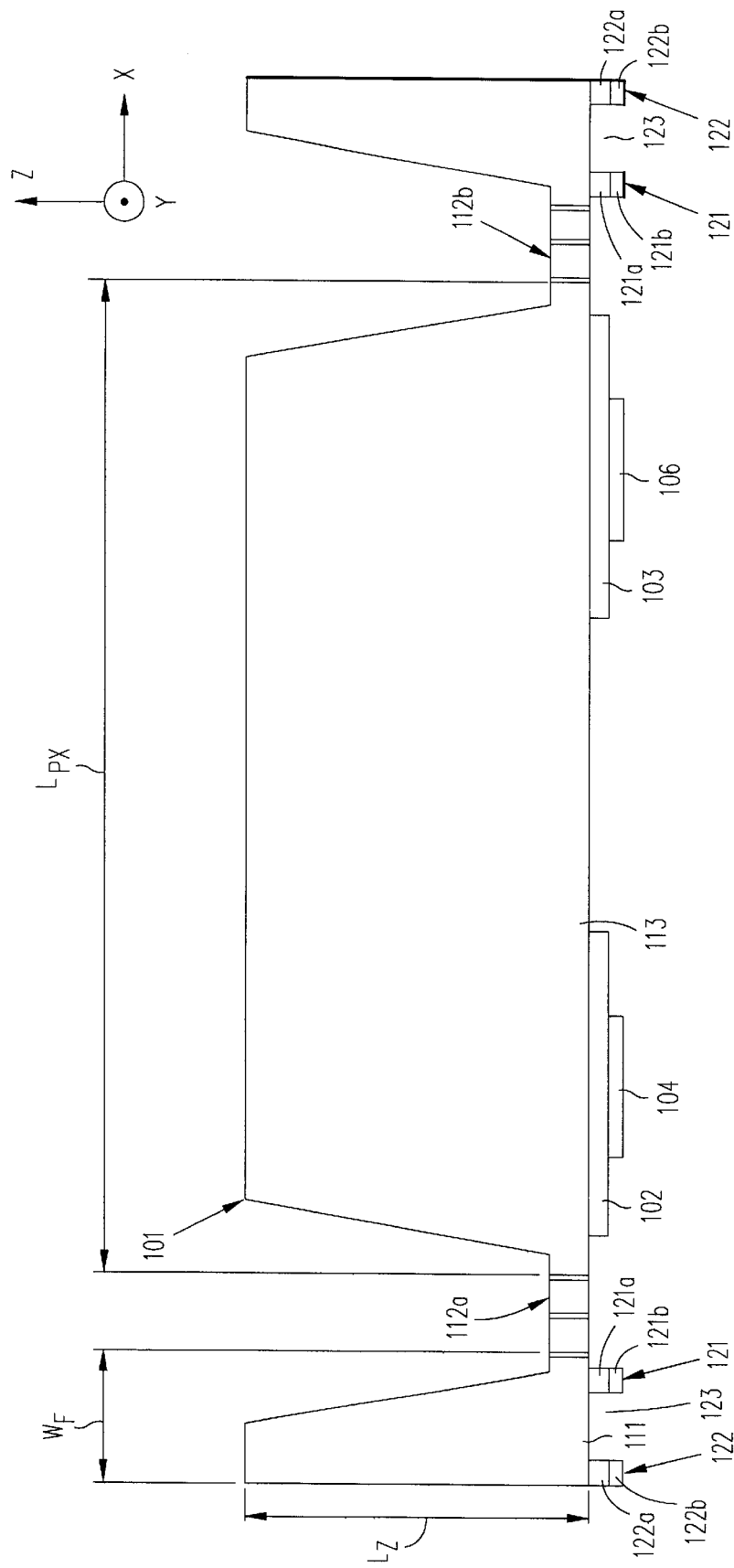
FIG. 2 is a cross sectional view of the upper structural member of FIG. 1 along section line 2—2 of FIG. 1.

FIG. 1 is a bottom view of an upper structural member 100 in accordance with one embodiment of the invention. FIG. 2 is a cross sectional view of upper structural member 100 along section line 2—2 of FIG. 1. FIGS. 1 and 2 use the illustrated X-Y-Z coordinate system. Structural member 100 includes a monocrystalline silicon structure 101 that has a frame portion 111, spring elements 112a–112d and platform portion 113. Spring elements 112a–112d extend from frame 111 to platform 113 in a serpentine pattern. Spring elements 112a–112d provide compliance along the Z-axis. Thus, when frame 111 is fixed and a force is applied to platform 113 along the Z-axis, platform 113 moves along the Z-axis at the ends of springs 112a–112d.

In a particular embodiment, silicon structure 101 has a length, $L_X$, along the X-axis of approximately 2.5 mm, and a length, $L_Y$, along the Y-axis of approximately 2 mm. In this embodiment, structure 101 has a height, $L_Z$, along the Z-axis of approximately 500 μm, while spring elements 112a–112d each have a height along the Z-axis of approximately 6 μm. Springs 112a–112d each have a width, $W_S$, of approximately 80 μm, and an effective length, $L_S$, of approximately 3.5 mm. Frame 111 has a width, $W_F$, Of approximately 0.6 mm. Platform 113 has a length, $L_{PX}$, along the X-axis of approximately 1.8 mm, and a length, $L_{PY}$ along the Y-axis of approximately 1.2 mm. These dimensions are illustrative and not limiting. Other dimensions are used in other embodiments of the invention.

Pole pieces 102 and 103 are located on the underside of platform 113. Pole tips 104–107 are located at the ends of pole pieces 102–103 as illustrated. In the described embodiment, pole pieces 102 and 103 and pole tips 104–107 are formed from a permanent magnetic material, such as cobalt-nickel alloy. In another embodiment, pole pieces 102 and 103 and pole tips 104–107 are formed from a ferro magnetic material such as permalloy. In the described embodiment, pole pieces 102 and 103 have a thickness along the Z-axis of approximately 25 μm, and pole tips 102 and 103 have a thickness along the Z-axis of approximately 10 μm. As described in more detail below, pole tips 104–107 are positioned on platform 113 such that these pole tips will be positioned over coils which are located on a corresponding lower structural member.

A pair of registration rails 121–122 run around the perimeter of the underside of frame 111. Rails 121 and 122 include rails 121a–121b and rails 122a–122b as illustrated in FIG. 2. A trough 123 is formed between rails 121 and 122. Rails 121a and 122a have a thickness along the Z-axis that is equal to the thickness of pole pieces 102 and 103 along the Z-axis, and similarly, rails 121b and 122b have a thickness equal to the thickness of pole pieces 104 and 106. Rails 121–122, pole pieces 102–103 and pole tips 104, 106 are typically fabricated simultaneously using the same material. Thus, in the described embodiment, rails 121a and 122a are cobalt-nickel alloy having a thickness of approximately 25 µm, and rails 121b and 122b are cobalt-nickel alloy having a thickness of 10 µm. As described in more detail below, rails 121 and 122 are used to hold a bonding material that connects upper structural member 100 to a corresponding lower structural member.

As an alternative to the rails, spacer bumps are formed on either the upper or lower structural members, to perform the same function as the rails. Such spacer bumps are described in more detail in connection with FIGS. 13–16.

Figure 3:
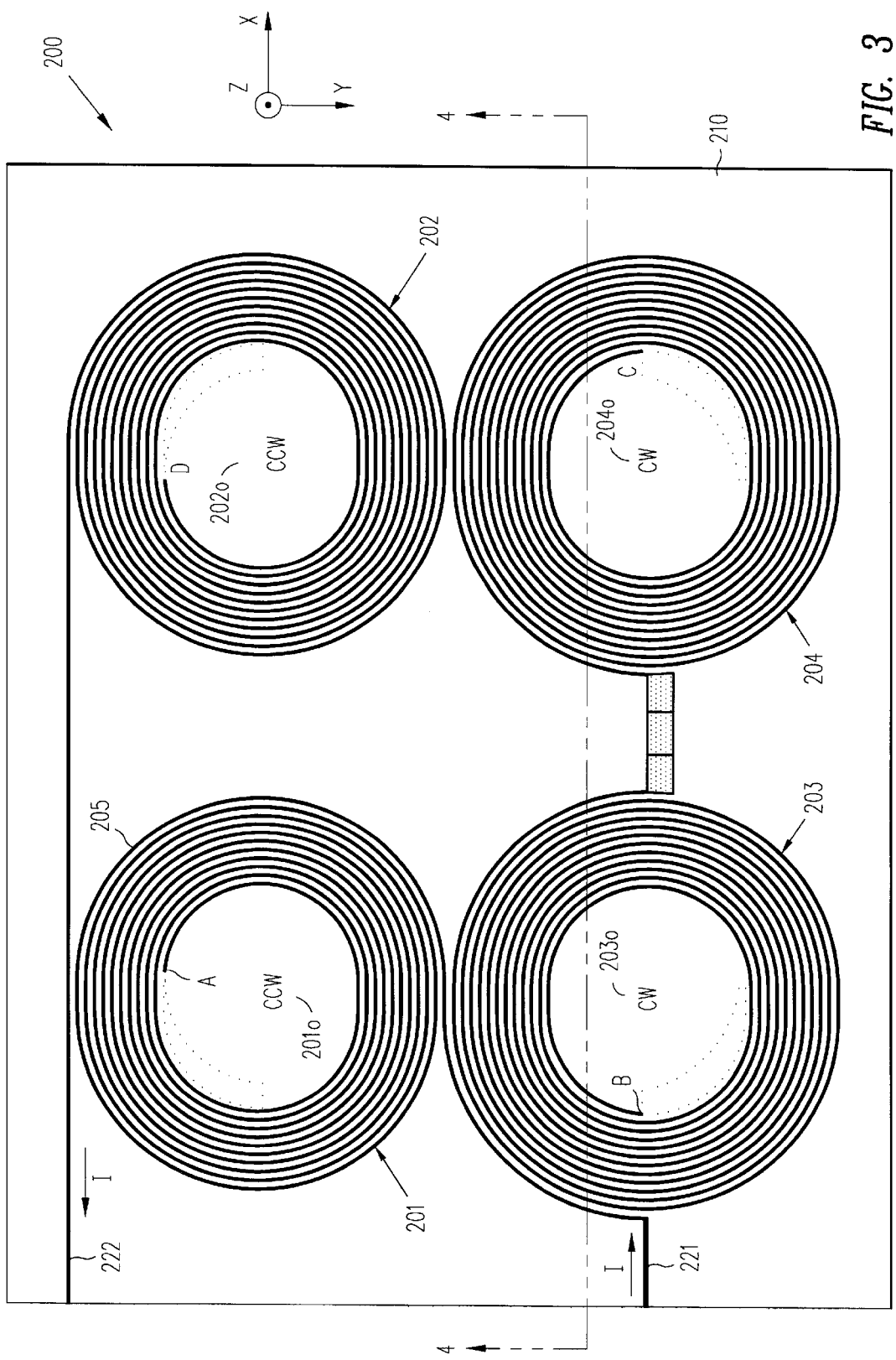
FIG. 3 is a top view of a lower structural member in accordance with one embodiment of the invention.
Figure 4:
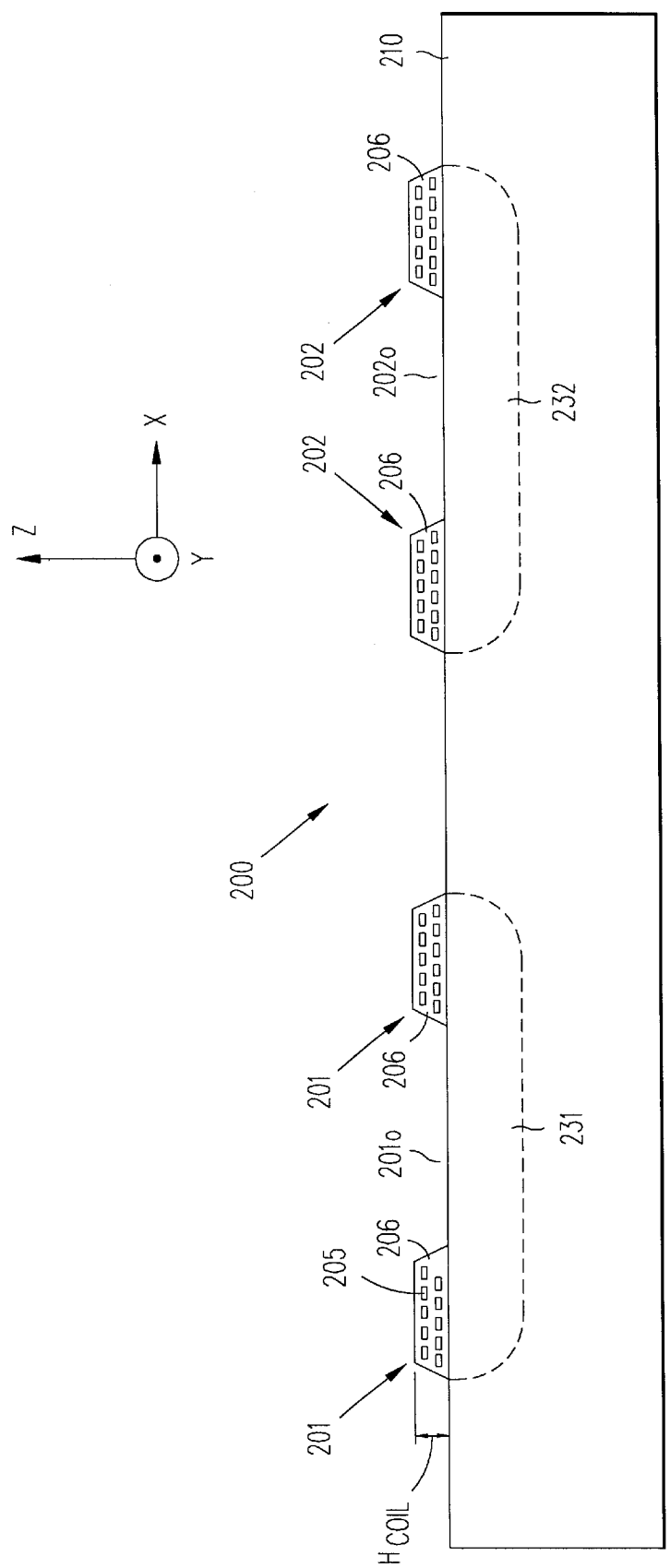
FIG. 4 is a cross sectional view of the lower structural member of FIG. 3 along section line 4—4 of FIG. 3.

FIG. 3 is a top view of lower structural member 200. FIG. 4 is a cross sectional view of lower structural member 200 along section line 4—4 of FIG. 3. FIGS. 3 and 4 use the same X-Y-Z coordinate system as FIGS. 1 and 2. As described in more detail below, upper structural member 100 is connected to lower structural member 200 to form a force-activated micro-sensor.

Lower structural member 200 includes four coils 201–204 located on substrate 210. In one embodiment, coils 201–204 are fabricated in accordance with techniques known to those skilled in the art. Each of coils 201–204 includes a plurality of electrically conductive windings, (e.g., winding 205) which are electrically isolated from adjacent windings by an insulating material 206. In a particular embodiment, the windings of coils 201–204 are made of copper. Openings 201o–204o are located at the respective central portions of coils 201–204. In one embodiment, openings 201o–204o each have diameters of approximately 400 µm, coils 201–204 have outer diameters of approximately 850 µm, and coils 201–204 have a height HCOIL along the Z-axis of approximately 10 µm.

End A of coil 201 is connected to end B of coil 203. Similarly, end C of coil 204 is connected to end D of coil 202. These connections are not shown for purposes of clarity. As a result of the previously described connections, a positive current flowing into lead 221 (and out of lead 222) causes current to flow in a clockwise direction in coils 203 and 204, and in a counterclockwise direction in coils 201 and 202.

In the illustrated embodiment, substrate 210 is a ferromagnetic material such as ferrite, having a thickness along the Z-axis of approximately 600 µm.

In a different embodiment, the substrate material can be a non-ferromagnetic material, such as silicon. In this case, trenches are etched into the silicon (using wet chemical or dry plasma) such that a first trench extends between coils 201 and 203 and such that a second trench extends between coils 202 and 204. The trenches (which can be from either side of the substrate 210) are then filled with a ferromagnetic material (e.g., permalloy) and the upper surface of the resulting structure is polished prior to forming coils 201–204. The locations of such trenches are illustrated as elements 231 and 232 in FIG. 4.

Figure 5A:
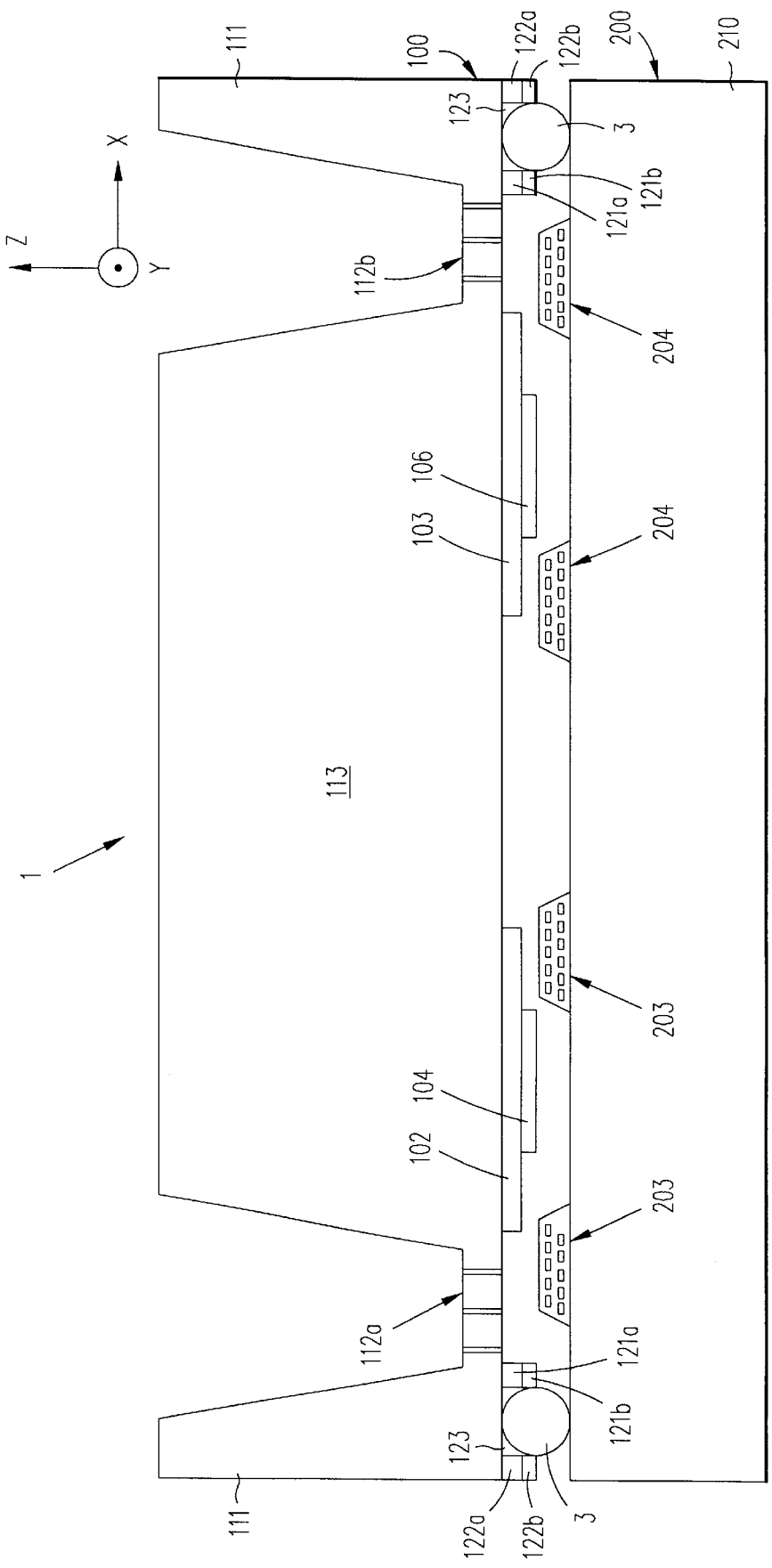
FIG. 5a is a cross sectional view illustrating a microsensor that is formed by connecting the upper structural member of FIGS. 1 and 2 to the lower structural member of FIGS. 3 and 4.

FIG. 5a is a cross sectional view illustrating micro-sensor 1 which is formed by connecting upper structural member 100 and lower structural member 200. In the illustrated embodiment, an adhesive that contains glass spacer beads 3 is located in trough 123 between rails 121 and 122. The diameter of glass beads 3 is selected to provide the desired spacing between structural members 100 and 200. In the present embodiment, beads 3 have a diameter of approximately 43 µm. Although not illustrated in FIG. 5a (as FIG. 5a is not to scale), trough 123 must be at least as wide as the diameter of beads 3. Additionally, the height of rails 121 and 122 along the Z-axis should be greater than the radius of beads 3, and less than the diameter of beads 3. Furthermore, the trough 123 for containing the adhesive can have other shapes. For example, straight channels or circular reservoirs with radial satellite channels can be used to retain the adhesive.

Other methods of attaching structural members 100 and 200 can be used in other embodiments. For example, glass rods (or glass fibers) can be used instead of glass beads 3. In another example, rails 121–122 are given a thickness equal to the desired spacing between the structural members 100 and 200. Rails 121–122 are then fixed to substrate 210 using an appropriate grade of adhesive. Other suitable methods and structures for connecting structural members 100 and 200 can also be used (for example, electroplated solder). Furthermore, a very shallow cavity (e.g., having a depth of 8 µm) can be etched into the bottom surface of the silicon platform 113. The pole pieces 102 and 103 and pole tips 104–107 are then electro-plated into this cavity. Since the rails 121 and 122 have the same thickness as the pole pieces 102–103 and pole tips 104–107, after assembly, the gap between the upper and lower structural members 100 and 200 will be equal to the cavity depth (e.g., 8 µm).

Yet another embodiment of connecting the upper and lower structural members 100 and 200 is described in more detail below in connection with FIGS. 13–16 and 19a–19h and 20. In general, spacer pads are etched in the upper surface of the lower structural member 200 (see FIGS. 19a–19h). The spacer pads are formed only in the area which is to be located immediately below the frame 111 of the upper structural member 100. The material deposited to form pole pieces 102–103 and pole tips 104–107 is also deposited to the same thickness over the entire underside of the frame 111. The spacer pads are then joined with the material deposited on the frame using a connective material such as solder. As a result, when the upper and lower structural members are joined, the height of the spacer pads defines the spacing between the pole pieces 104–107 and the coils 201–204.

Micro-sensor 1 operates as follows. When no external force is applied to platform 113, micro-sensor 1 remains in the position illustrated in FIG. 5a. That is, there is no relative motion between pole pieces 104–107 and corresponding coils 201–204. As a result, no current is induced in coils 201–204.

When an external force is applied to platform 113, springs 112a–112d flex to allow platform 113 to move up and down along the Z-axis. When pole pieces 104–107 move in and out of corresponding coils 201–204, currents are induced in coils 201–204. Voltages can be measured across the coils 201–204. These voltages are proportions to the velocity of the movement of the pole pieces 104–b107. Because displacement is proportional to imposed acceleration, velocity is proportional to jerk (i.e., the time derivative of acceleration).

It is also possible to measure external forces along the X-Y plane (i.e., in-plane forces) since the platform 113 has a center-of-mass that is offset from springs 112a and 112b. In the presence of in-plane forces, the platform 113 will pitch or roll, thereby causing an increase in voltage in two of coils 201–204 and a decrease in voltage in the other two of coils 201–204. That is, the voltages induced in coils 201, 202, 203 and 204 are proportional to vertical shock, while the voltages induced in coils 201 and 202 minus the voltages induced in coils 203 and 204 will be proportional to the shock along the X-axis.

If the shock forces are excessive, the permanent magnetic pole pieces 104–107 will come into contact with the permalloy substrate 210 (or the permalloy trenches 231–232), thereby causing these elements to stick together. The microsensor 1 can therefore be used as a shock fuse or latchable shock sensor.

In an embodiment where pole pieces 104–107 are not permanently magnetized (e.g., when pole pieces 104–107 are permalloy), motion of the platform 113 can be determined by monitoring coils 201–204 for changes in inductance or coupling between the various coils if one of the coils is driven with an AC signal.

Figure 5B:
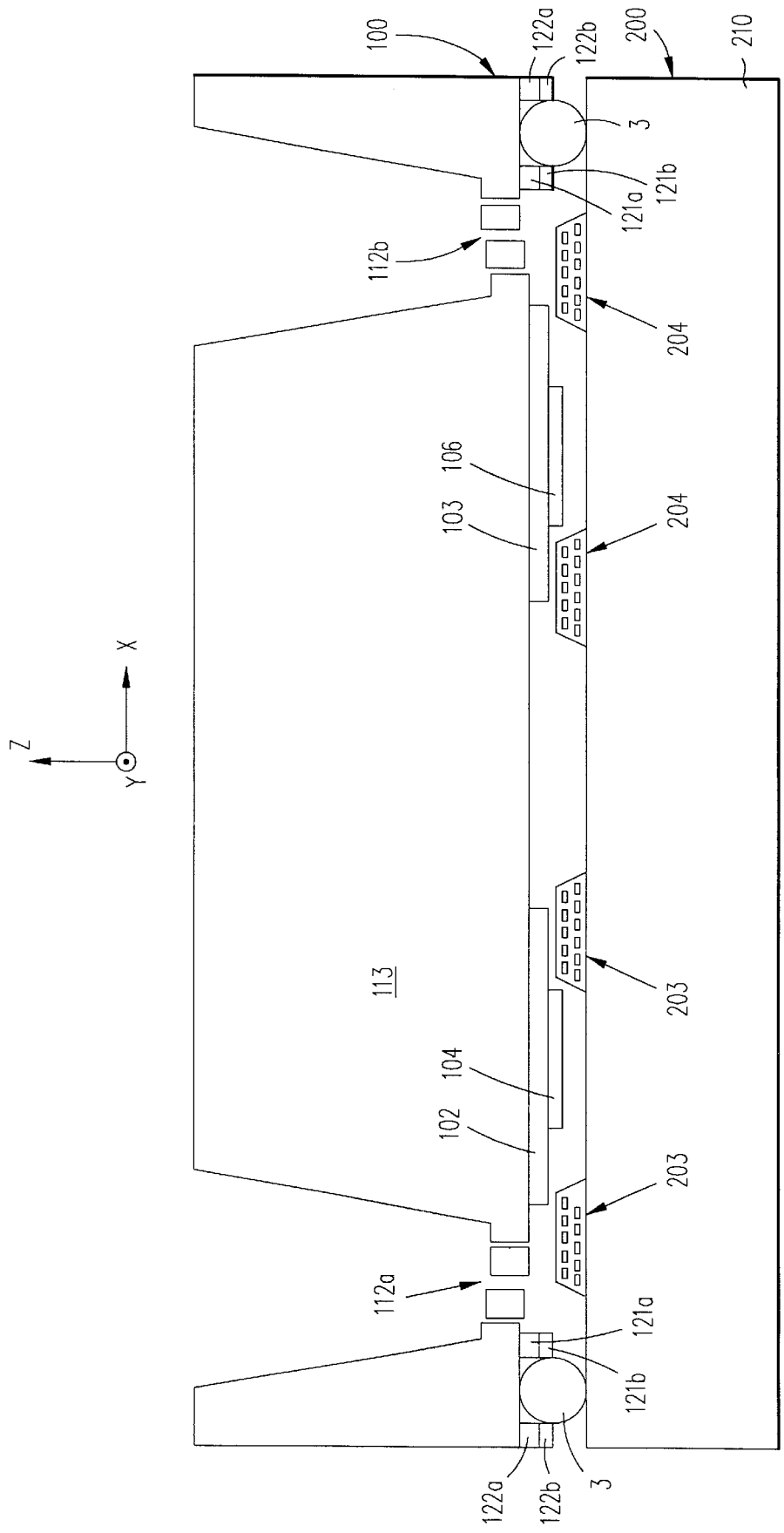
FIG. 5b is a cross sectional view illustrating the microsensor of FIG. 5a in a closed position.

FIG. 5b illustrates micro-sensor 1 when pole tips 104–107 are deflected into coils 201–204. Note that springs 112a–112d and platform 113 are forced downward along the Z-axis, out of the plane of frame 111. By carefully designing the stiffness of the springs, external forces in the proper range will cause platform 113 to move along the Z-axis.

The single crystal structure of monocrystalline structure 101 provides mechanical advantages, such as superior stiffness, durability, fatigue and deformation characteristics. The processing of the single crystal monocrystalline structure results in a relatively defect-free structure.

The fabrication of structural members 100 and 200 will now be described in detail. In accordance with one embodiment of the invention, upper structural member 100 is fabricated as follows. Silicon structure 101 is formed from a monocrystalline silicon wafer having a <100> crystalline structure. In the illustrated embodiment, monocrystalline structure 101 has a thickness of approximately 500 $\mu$m. Other monocrystalline semiconductor materials can also be used to form structure 101.

Figure 6A:
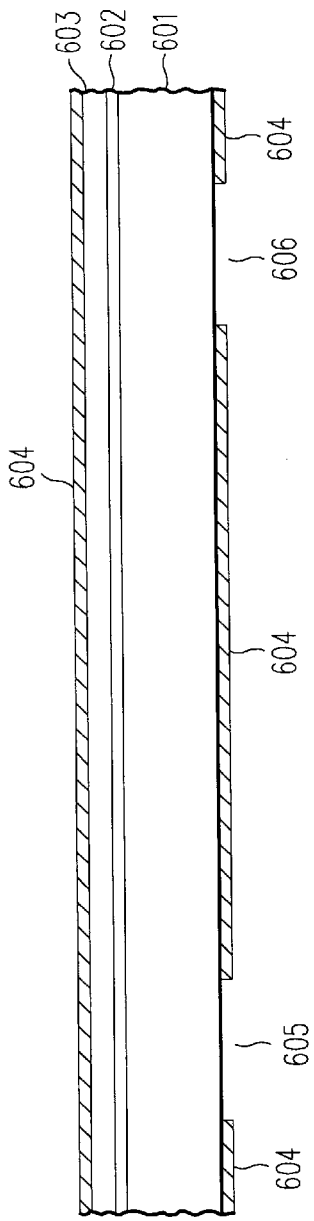
FIGS. 6a–6c are cross sectional views illustrating the fabrication of a portion of an upper structural member.
Figure 6B:
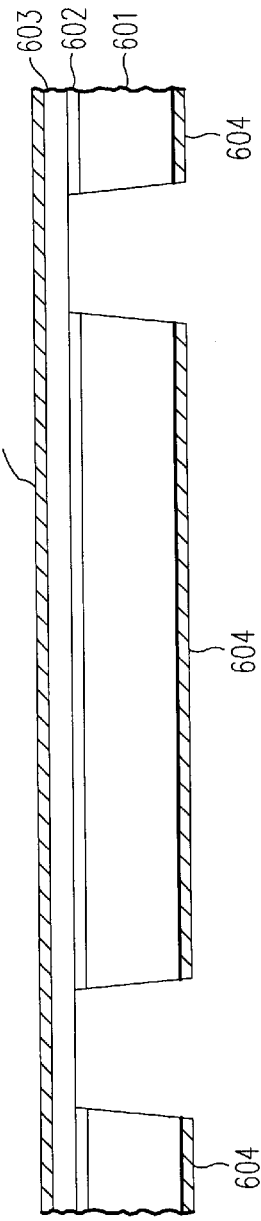
Figure 6C:
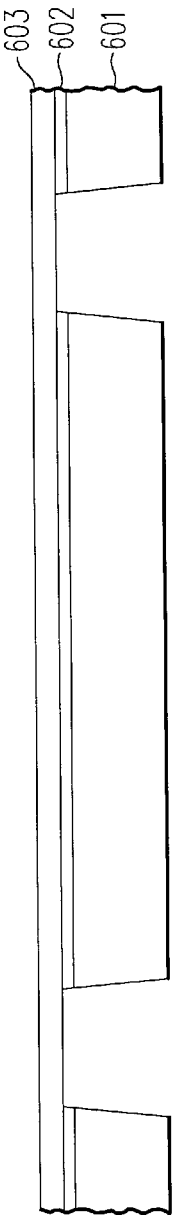

FIGS. 6a–6c illustrate a method for forming silicon structure 101. In this embodiment, an upper surface of silicon wafer 601 is polished. As shown in FIG. 6a, a boron doped monocrystalline silicon layer 602 having a thickness of 2 to 3 microns is epitaxially grown (or thermally diffused) on this polished upper surface using conventional silicon processing techniques. A lightly doped monocrystalline silicon layer 603 having the desired monocrystalline spring thickness (e.g., 5 to 30 $\mu$m) is then epitaxially grown on the boron doped silicon layer 602 using conventional processing techniques. The resulting structure is thermally oxidized such that a thin layer of oxide 604 (about 1 $\mu$m) is grown on the external wafer surfaces. Oxide 604 on the bottom surface of wafer 601 is patterned with photoresist (not shown) such that there are a number of rectangular openings. The oxide within each of these openings is removed such that there are a number of openings 605–606 formed in oxide layer 604 at the bottom surface of silicon substrate 601.

As shown in FIG. 6b, silicon wafer 601 is etched from its backside using an etchant that attacks the silicon through openings 605–606. The etchant has a characteristic such that the original undoped silicon wafer 601 is etched relatively quickly and the boron doped silicon layer 602 is etched relatively slowly. The backside etch continues until only the boron doped layer 602 and the lightly doped epitaxial silicon layer 603 remain. The exposed boron-doped silicon layer 602 is removed using a different etchant that etches only boron-doped silicon. As a result, only lightly doped silicon layer 603 remains in the locations defined by openings 605–606. Openings 605–606 define frame 111 and platform 113 of the upper structural member 100. Oxide 604 is removed, leaving the structure of FIG. 6c. The structure of FIG. 6c is inverted and used to form upper structural member 100. In general, layer 603 is used to form the spring elements of the upper structural member, while layers 601 and 602 form the frame and platform portions of the upper structural member. In one embodiment, a plurality of upper structural members are simultaneously fabricated on a single wafer using the described processing techniques.

Figure 7A:
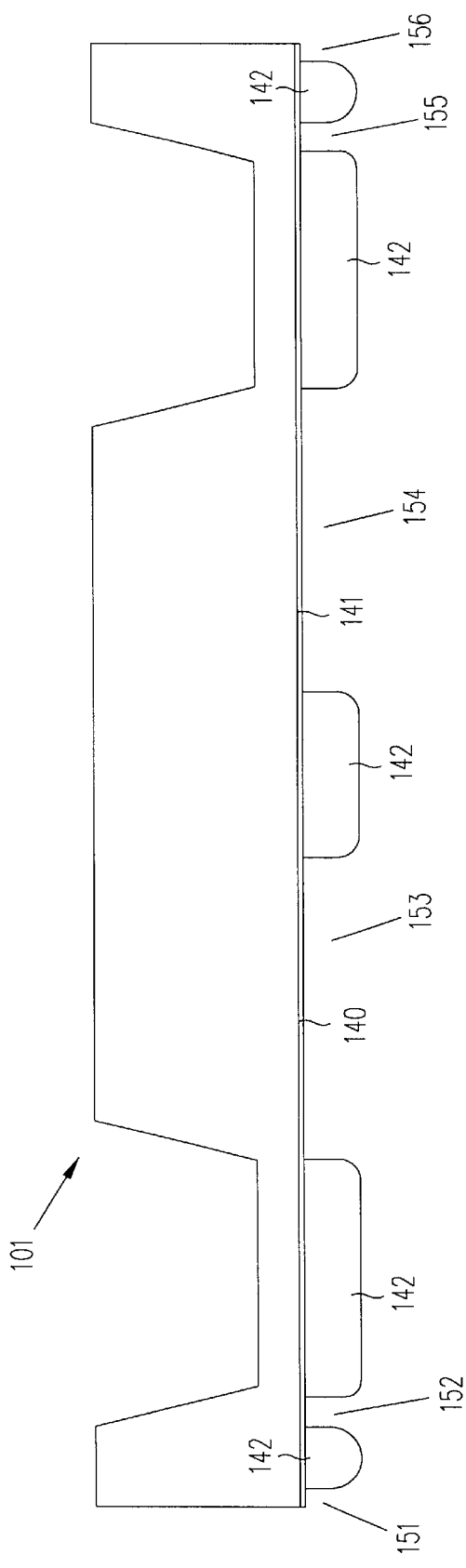
FIGS. 7a–7e are cross sectional views illustrating the fabrication of the upper structural member of FIGS. 1 and 2 in accordance with one embodiment of the invention.

Besides using a boron-doped layer as the etch stop, there are many other techniques which can be used to control the thickness of spring elements 112a–112d. For example, monocrystalline structure 101 can be lightly-doped and a potential difference can be applied across the monocrystalline structure and the silicon substrate to form a P-N junction which acts as an electrochemical etch stop. A timed etch can also be performed to control the thickness. The formation of upper structural member 100 from monocrystalline structure 101 is illustrated in FIGS. 7a–7e, which are views along section line 2—2 of FIG. 1. As illustrated in FIG. 7a, a metal seed layer 140 is sputtered (or evaporated) over lower surface 141 of monocrystalline structure 101 to a thickness of approximately 1000 angstroms. Seed layer 140 can be, for example, titanium/copper, chrome/copper or permalloy). A photoresist layer 142 is spun over seed layer 140. Photoresist layer 142 is exposed through a reticle (not shown) and developed to form openings 151–156.

Figure 7B:
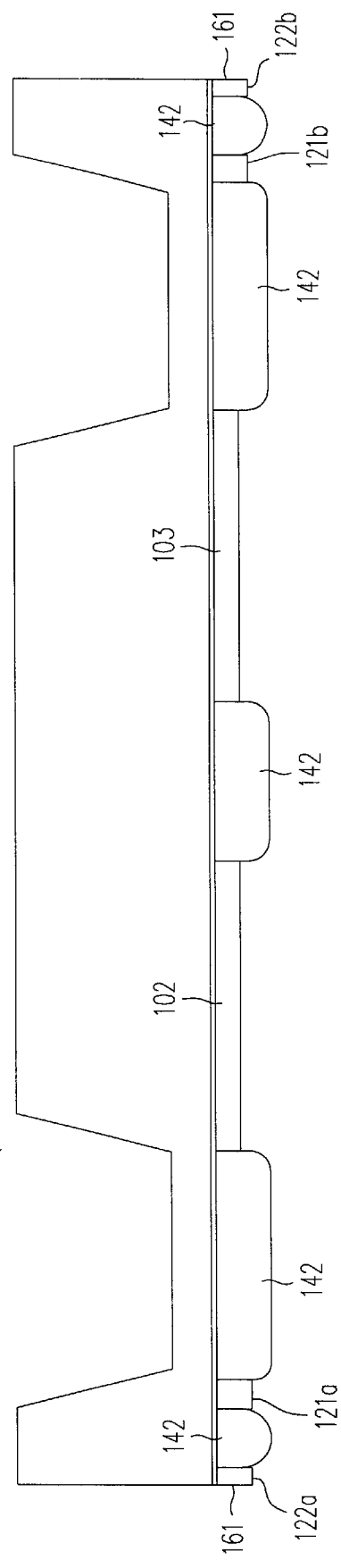
Figure 7C:
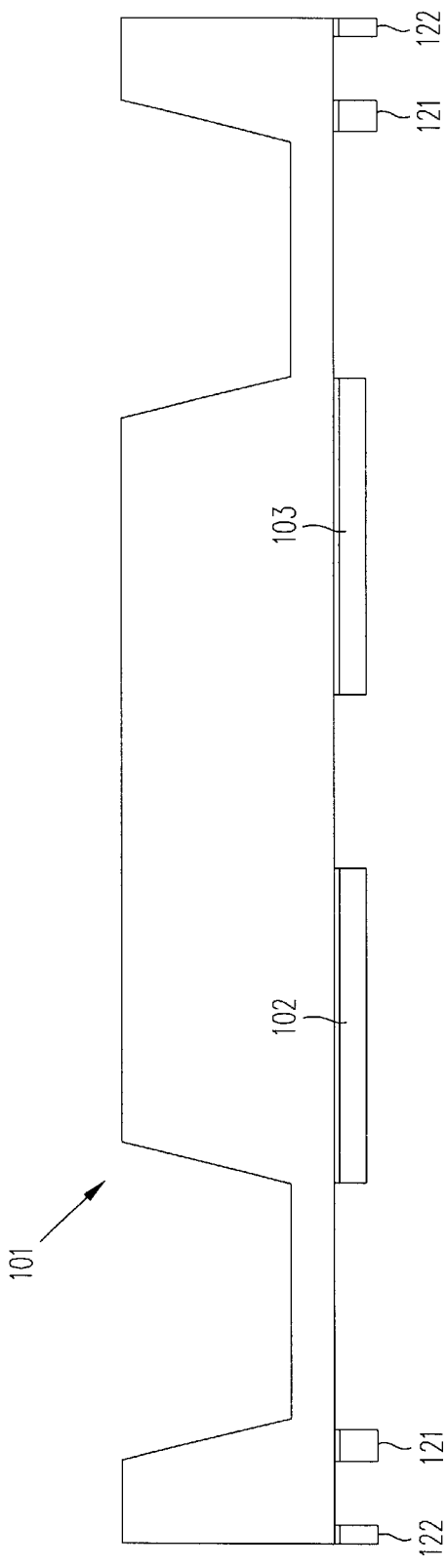

As shown in FIG. 7b, a first layer 161 of magnetic material, such as cobalt-nickel alloy or permalloy, is electroplated onto seed layer 140 through openings 151–156 using conventional electroplating steps. First magnetic layer 161 forms rails 121a and 122a, and pole pieces 102 and 103. In the illustrated embodiment, first magnetic layer 161 has a thickness of 25 $\mu$m. Photoresist layer 142 and the exposed portions of seed layer 140 are stripped as shown in FIG. 7c.

Figure 7D:
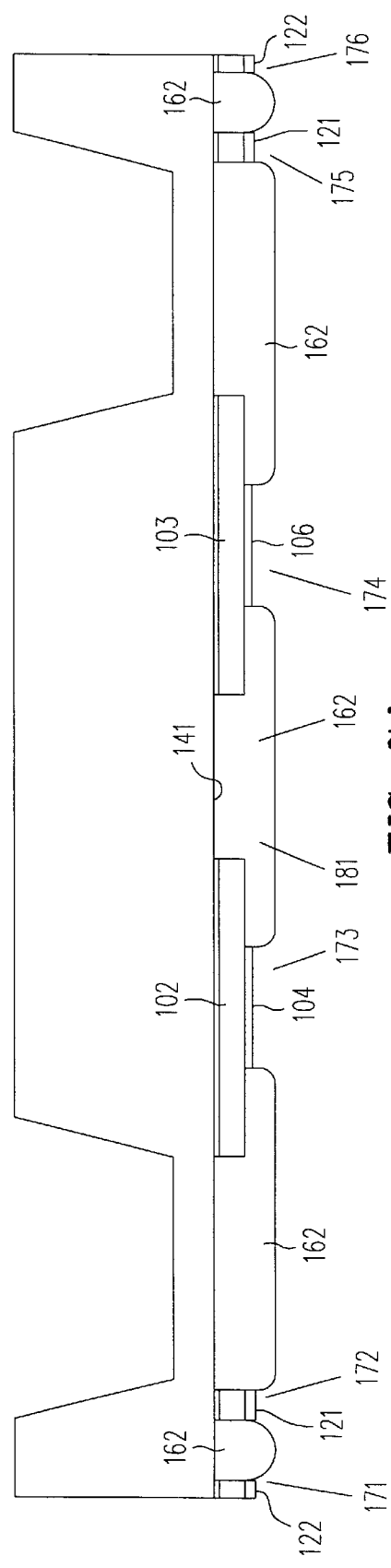

A second photoresist layer 162 is formed over the resulting structure as illustrated in FIG. 7d. Second photoresist layer 162 is patterned, in the same manner previously described in connection with photoresist layer 142, to create openings 171–176. A second layer 163 of magnetic material is electroplated onto the portions of the first magnetic layer 161 that are exposed by openings 171–176. Second magnetic layer 163 forms pole tips 104–107 and rail portions 121b and 122b. In the illustrated embodiment, the thickness of second magnetic layer 163 is approximately 10 $\mu$m.

Figure 7E:
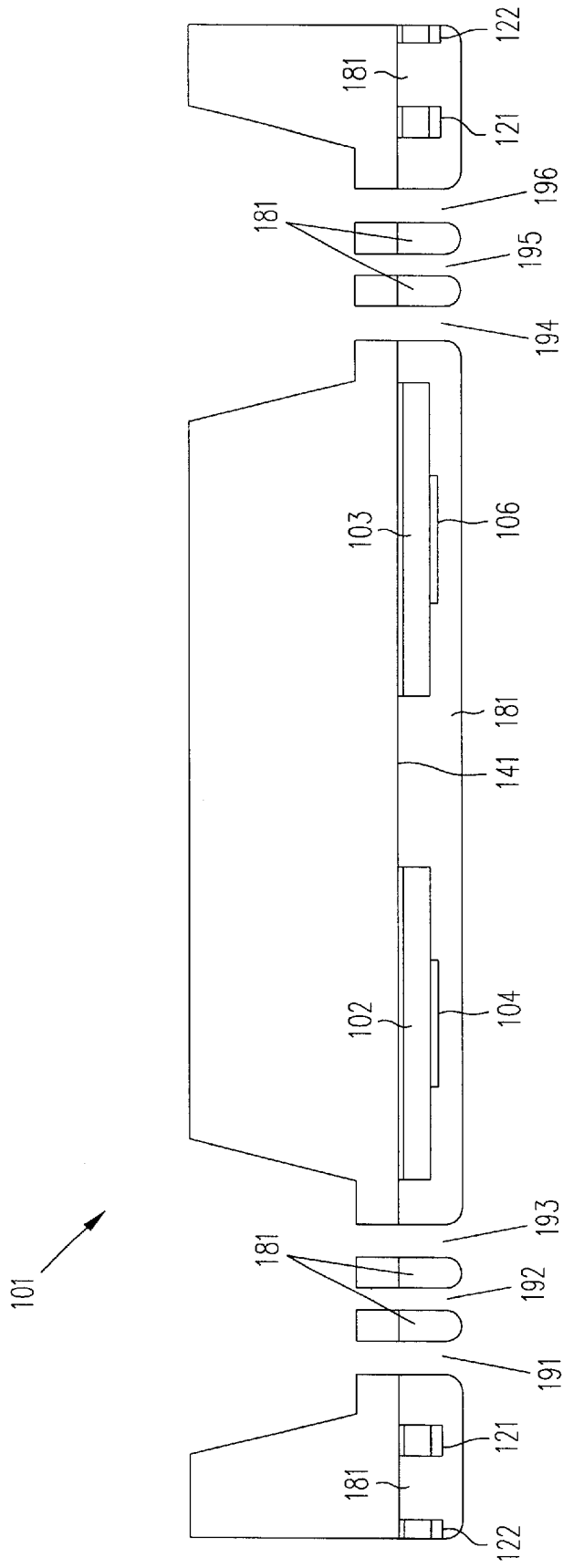

Third photoresist layer 181 is formed over lower surface 141 or upper surface 180 of the resulting structure. In FIG. 7e, photoresist layer 181 is shown over the lower surface 141 of monocrystalline structure 101. Openings 191–196 are formed in photoresist layer 181. These openings define spring elements 112a and 112b. An anisotropic plasma etch of monocrystalline structure 101 is performed through openings 191–196, thereby forming spring elements 112a–112d as illustrated in FIGS. 1 and 2. Although spring elements 112a–112d are shown as having a specific serpentine design in FIG. 1, other spring designs are contemplated and considered within the scope of the invention. For example, to further reduce the spring stiffness, two of the spring elements 112a–112d can be eliminated from the design, such that the platform is only supported by two spring elements (e.g., 112b and 112c). In the previously described steps, instead of photoresist, other masking material can be used including oxide, chrome, aluminum and nickel.

Figure 8C:
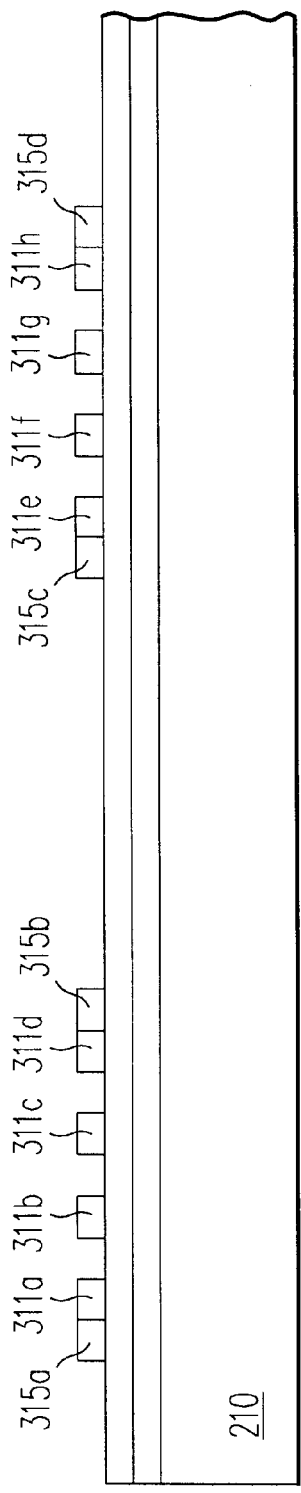

Lower structural element 200 is fabricated as illustrated in FIGS. 8a–8g. FIGS. 8a–8g illustrate the fabrication of coil 203 along section line 4—4 of FIG. 3. Substrate 210 is either ferromagnetic material having a polished upper surface (which could be the entire substrate or a thin film laminated onto another substrate) or a non-ferromagnetic material with ferromagnetic material filled in cavities. In one embodiment, substrate 210 is a solid ferrite wafer having a thickness of approximately 600 μm. As illustrated in FIG. 8a, an insulating layer 301 is deposited over the upper surface of substrate 210. A titanium/copper (or other metals) seed layer 302 is deposited over insulating layer 301 to a thickness of approximately 1000 Å. A layer of photoresist 303 is spun over seed layer 302. In the illustrated embodiment, photoresist layer 303 is made from a positive photoresist material. That is, exposed portions of photoresist layer 303 are removed when photoresist layer 303 is developed. Photoresist layer 303 is exposed through reticle 304 and developed. Openings 310a–310h are formed through photoresist layer 303 as a result. Openings 310a–310h define a first layer of windings of coil 203.

As shown in FIG. 8b, copper traces 311a–311h are electroplated through openings 310a–310h in photoresist layer 303. The resulting structure is exposed through reticle 313 and developed. Reticle 313 prevents the portions of photoresist layer 303 immediately adjacent to the innermost portions of copper traces 311d and 311e, and the outermost portions of copper traces 311a and 311h from being exposed. This is possible since the electroplating and all other related processes are done in a yellowlighting environment. Thus, after photoresist layer 303 is developed, the unexposed photoresist portions 315a–315d remain as illustrated in FIG. 8c. The resulting structure is baked, thereby hardening photoresist spacers 315a–315d.

Figure 8D:
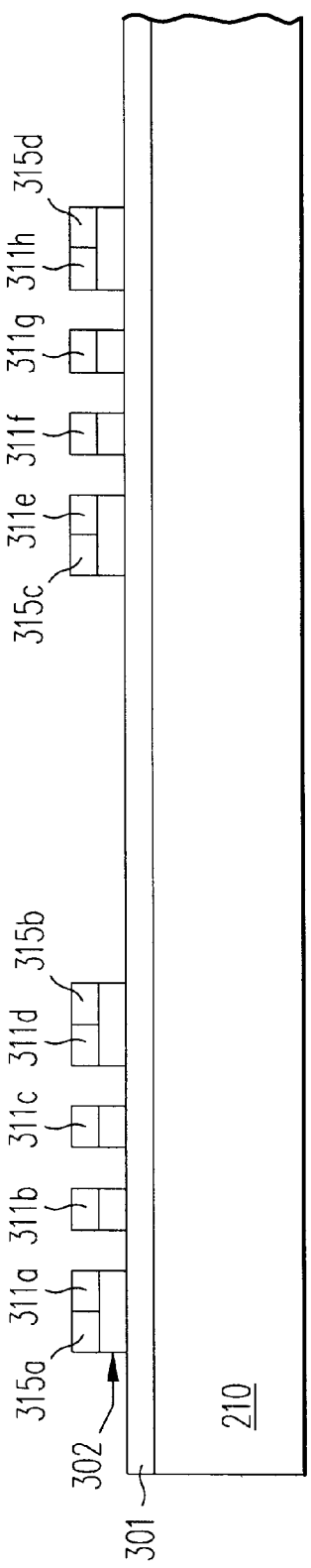

After removing the photoresist, seed layer 302 is removed, except at the places where traces 311a–311h overlie seed layer 302 (FIG. 8d). Seed layer 302 is removed using a conventional technique such as ion-milling, sputter-etching or wet-chemical etching.

Figure 8E:
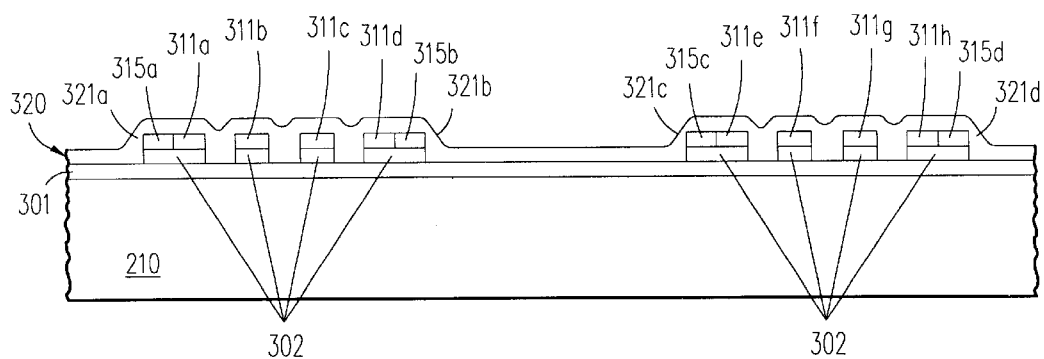

An insulating layer 320 of photoresist, polyimide, spin-on glass or PECVD oxide is deposited over the surface of the resulting structure as illustrated in FIG. 8e to a thickness of approximately 2 μm. Layer 320 isolates traces 311a–311h from subsequently formed layers of traces. Contact openings (not shown) are formed through insulating layer 320 to allow selective interconnection of traces 311a–311h to an overlying layer of traces (not shown in FIG. Be) to form a coil. Typically, insulating layer 320 is thinnest at points 321a–321d. However, the structure immediately adjacent to these thin points 321a–321d is the underlying photoresist spacers 315a–315d. Thus, even if insulating layer 320 does not provide complete coverage at points 321a–321d, coil 203 will still be functional (i.e., no shorts will exist between coil windings) because photoresist spacers 315a–315d do not carry current in coil 203.

Figure 8F:
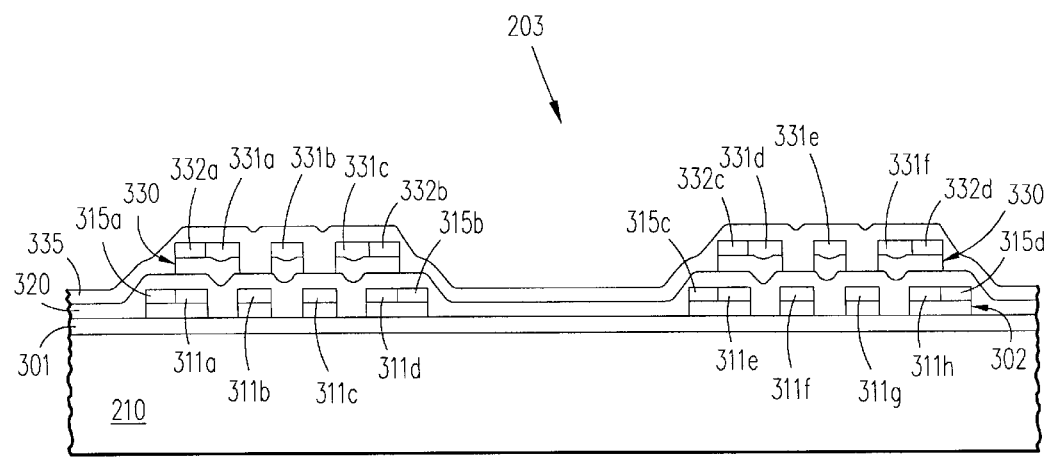
Figure 8G:
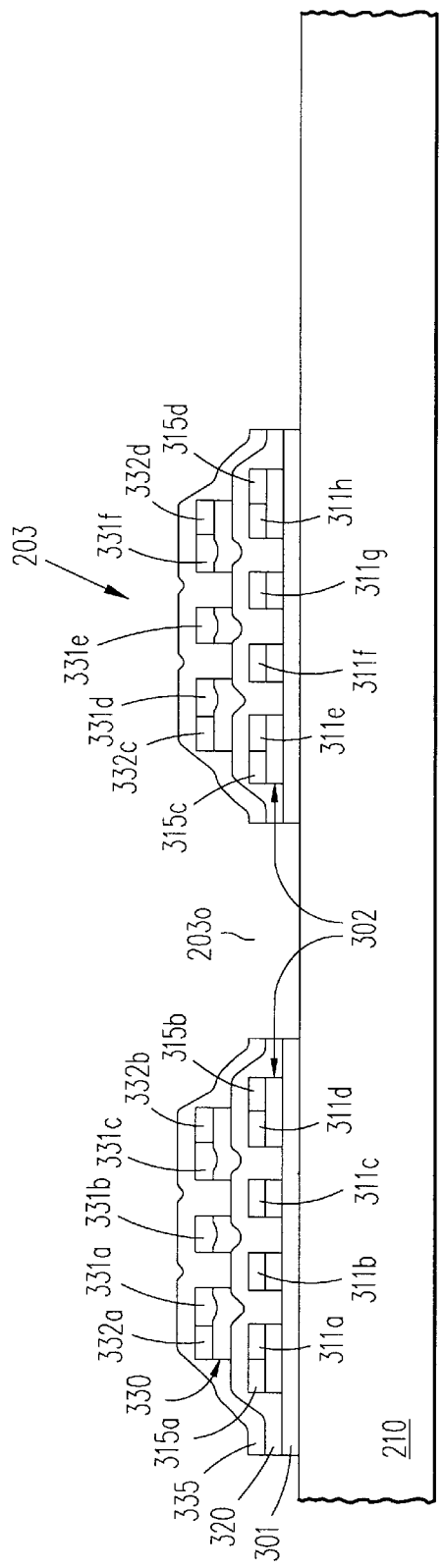
Figure 8H:
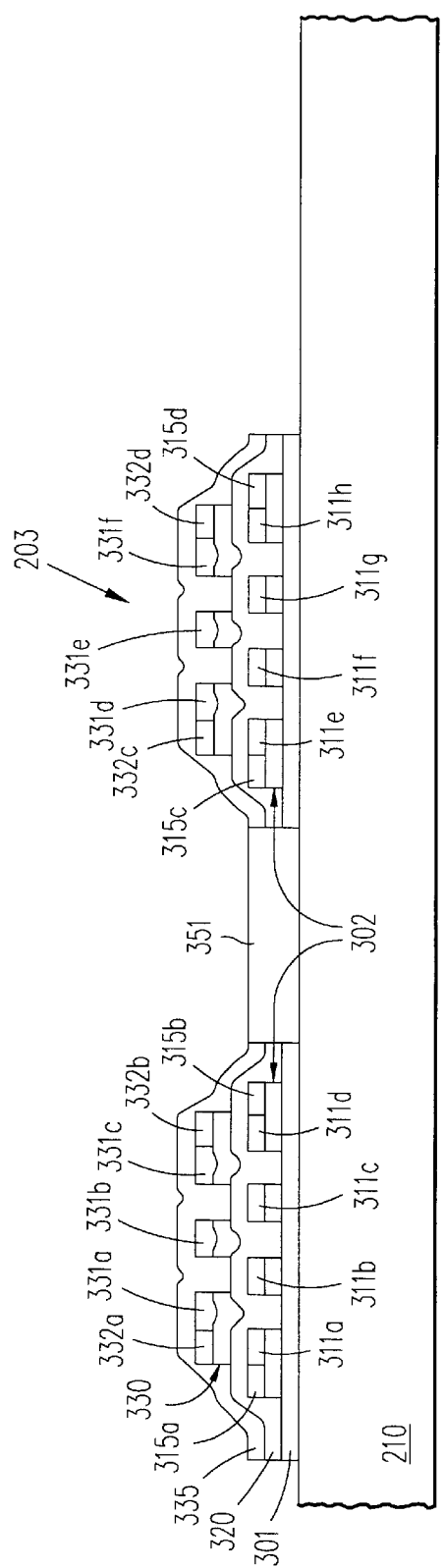

As illustrated in FIG. 8f, a second winding structure is formed over insulating layer 320 in the same manner that the first winding structure of FIGS. 8a–8e was formed on insulating layer 301. The second winding structure includes seed layer 330, copper traces 331a–331h, photoresist spacers 332a–332d and insulating layer 335. Again, photoresist spacers 332a–332d are located immediately adjacent to the thinnest portions of overlying insulating layer 335, thereby preventing electrical shorts within coil 203. The portions of insulating layers 301, 320 and 335 which surround coil 203 are removed as illustrated in FIG. 8g.

Figure 9A:
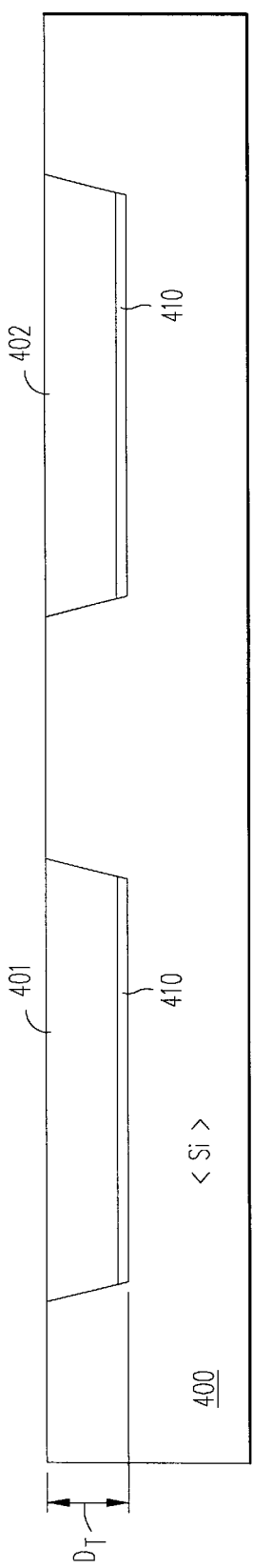
FIGS. 9a and 9b are cross sectional and top views, respectively, of a portion of a lower structural member in accordance with an alternative embodiment.
Figure 9B:
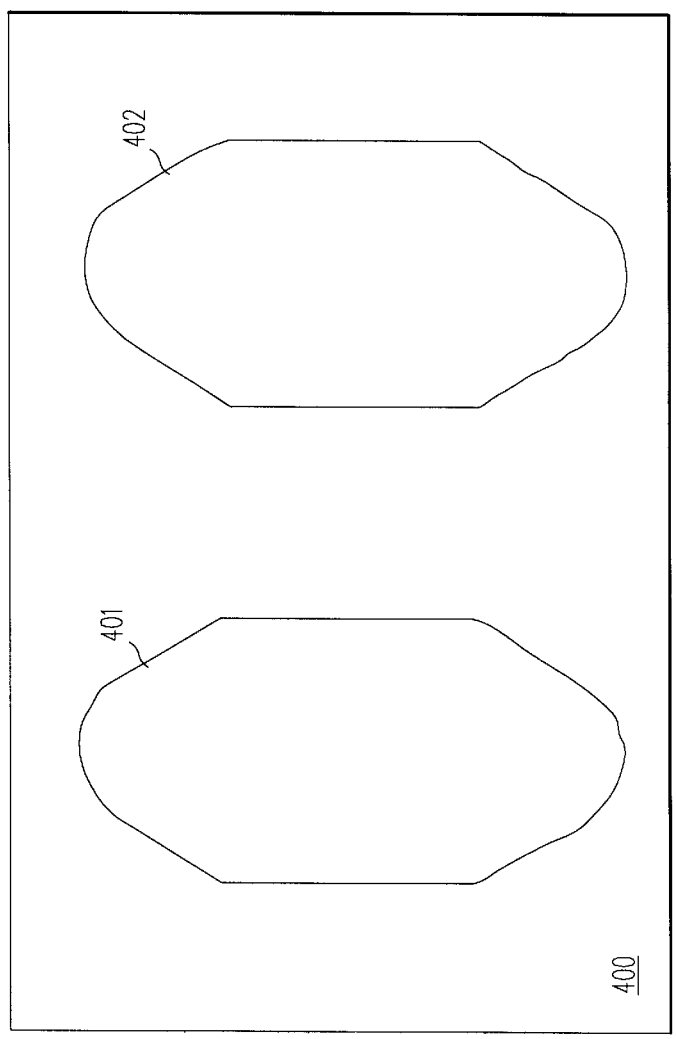

FIGS. 9a and 9b illustrate cross sectional and top views, respectively, of a portion of lower structural member 200 in accordance with an alternative embodiment. In this embodiment, lower structural member 200 is formed from a monocrystalline silicon substrate 400. As illustrated in FIG. 9a, a pair of trenches is etched into the upper surface of silicon substrate 400. A seed layer 410 is sputtered on the bottom of trenches, and ferromagnetic pole pieces 401–402 are electroplated on seed layer 410. In one embodiment, pole pieces 401–402 have a depth D in the range of 20 to 40 μm. As illustrated in FIG. 9b, pole pieces 401 and 402 extend along the magnetic pathways between coils 201–203 and 202–204. Coils 201–204 are formed over the resulting structure in the same manner previously described in connection with FIGS. 8a–8h.

Besides the low-cost of the silicon substrate, this embodiment provides the further advantage of allowing other semiconductor devices (e.g., transistors, diodes, resistors, capacitors) to be fabricated in silicon substrate 400. These semiconductor devices can form circuitry that is used to interface with the micro-sensor 1. In addition to integrating microelectronic devices into substrate 400, these devices can be fabricated separately and later bonded to substrate 400 (which can be silicon or not), in areas adjacent to upper structural member 100.

Figure 10:
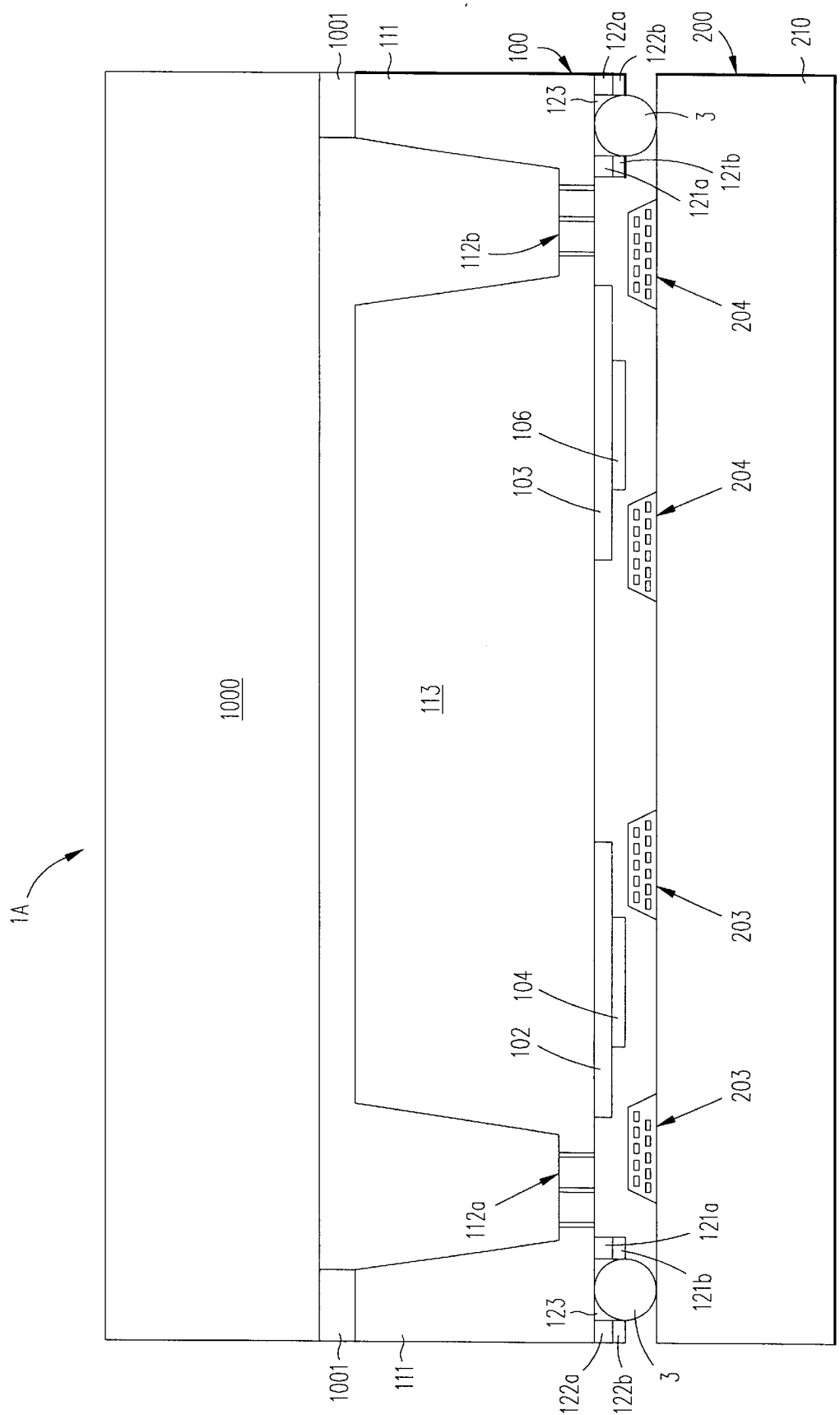
FIG. 10 is cross sectional view of the micro-sensor of FIG. 5a with a cover substrate.

As illustrated in FIG. 10, a semiconductor substrate 1000 can be attached to the upper surface of the upper structural member 100 to provide a cover for micro-sensor 1. This cover 1000 keeps debris and contaminants away from the insides of micro-sensor 1, as well as providing a mechanical stopper to prevent platform 113 from moving an excessive distance in the positive Z direction. Cover 1000 is attached to frame 111 with a material 1001, such as solder, which has a thickness sufficient to ensure that the upper surface of platform 113 is not in contact with the lower surface of cover 1000 when the micro-sensor 1 is at rest. Cover 1000 can be a microcircuit chip that provides the electronics associated with micro-sensor 1 (i.e., signal conditioning, power drivers and multiplex logic). In such an embodiment, small holes (not shown) can be etched through the frame 111 of upper structural member 100. Copper/solder can be electroplated into these holes in order to connect the microelectronics in cover substrate 1000 to the coils 201–204. Note that frame 111 would have to be wider than illustrated in FIG. 10 to provide the appropriate area to locate the through holes.

Figure 11:
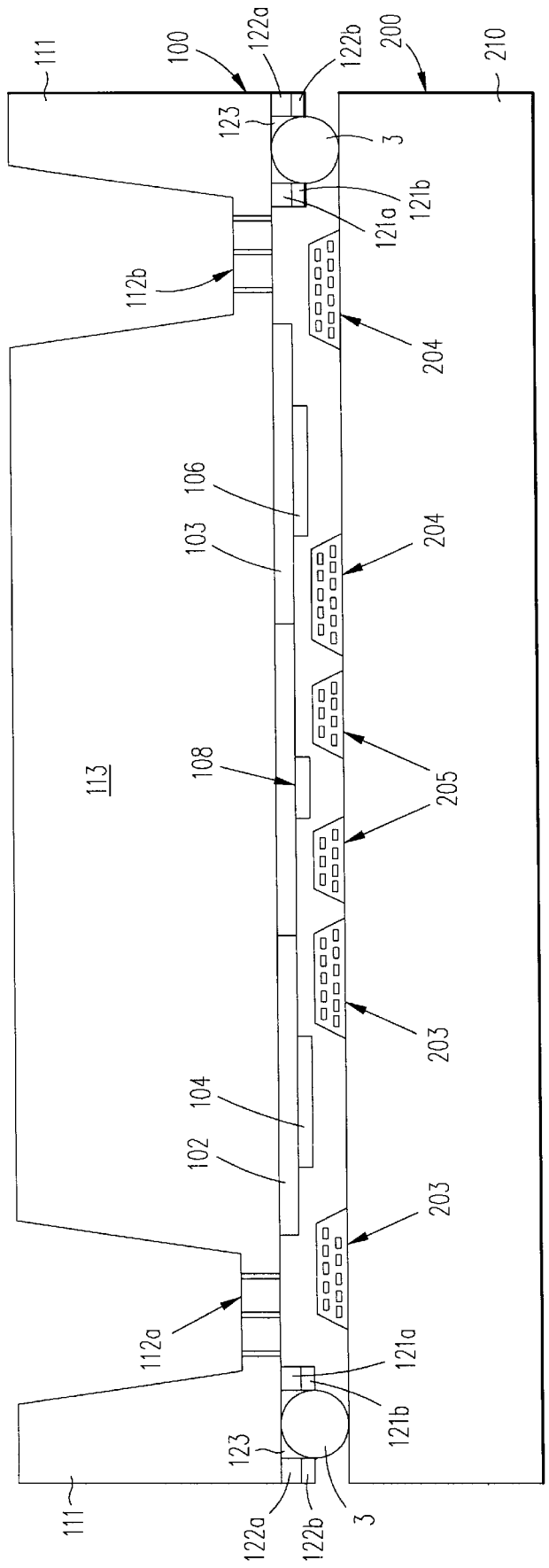
FIG. 11 is a cross sectional view of a micro-sensor in accordance with another embodiment of the present invention.

FIG. 11 is a cross sectional view of a micro-sensor 1A in accordance with another embodiment of the present invention. Because micro-sensor 1A is similar to microsensor 1 (FIG. 5), similar elements in FIGS. 5 and 11 are shown with similar reference numbers. Micro-sensor 1A additionally includes a fifth planar coil 205 formed in the middle of coils 201–204, and a corresponding pole piece 108 formed in the middle of pole pieces 104–107. Pole piece 108, which is continuous with pole pieces 104–107 moves in and out of coil 205 when platform 113 moves down and up, respectively. In this embodiment, a high frequency signal is injected to fifth coil 205. As a result, signals are induced in the outer coils 201–204. If an external force is applied to micro-sensor 1A, then platform 113 moves and there is a change in the amplitudes of the signals picked up by the coils 201–204. If the platform 113 moves along the Z-axis, then the changes in the signals in all four coils 201–204 are the same. If the platform 113 pitches or rolls, the changes in the signals in the four coils 201–204 will be different. The sums and differences of the signal changes in the four coils 201–204 will indicate the direction and magnitude of pitch and/or roll.

Micro-sensor 1A operates under the same principles as a conventional linear voltage differential transformer (LVDT). However, a conventional LVDT typically includes a row of three coils that surround a movable ferromagnetic insert. A signal is applied to the middle coil, while signals are induced in the coils located on either side of the middle coil. As the ferromagnetic insert (which is rigidly attached to a piece of machinery) is moved in and out of the coils, a difference in signal amplitudes can be detected.

Micro-sensor 1A can also be used in a closed-loop configuration to improve switch performance. In this variation, if the signals induced in coils 201 and 203 are greater than the signals induced in coils 202 and 204 (meaning that the external force has caused platform 113 to pitch towards coils 201 and 203), then an external signal can be applied to coils 202 and 204 to stabilize the pitch of platform 113. As a result, the signal applied to the coils to stabilize the device will be proportional to the externally imposed shock. This results in an extremely sensitive and linear micro-sensor.

Figure 12:
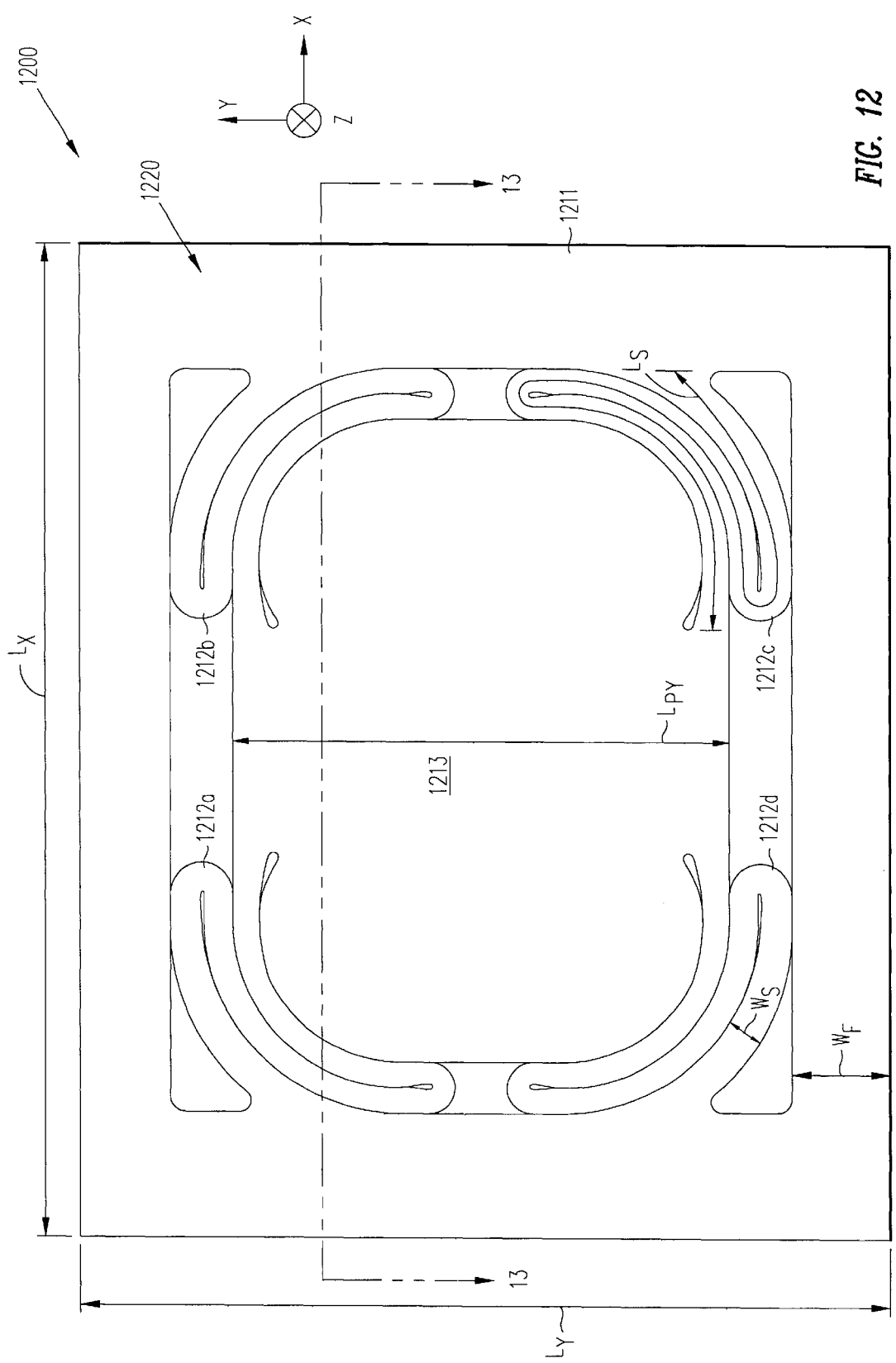
FIG. 12 is a bottom view of an upper structural member in accordance with an alternative embodiment of the present invention.
Figure 13:
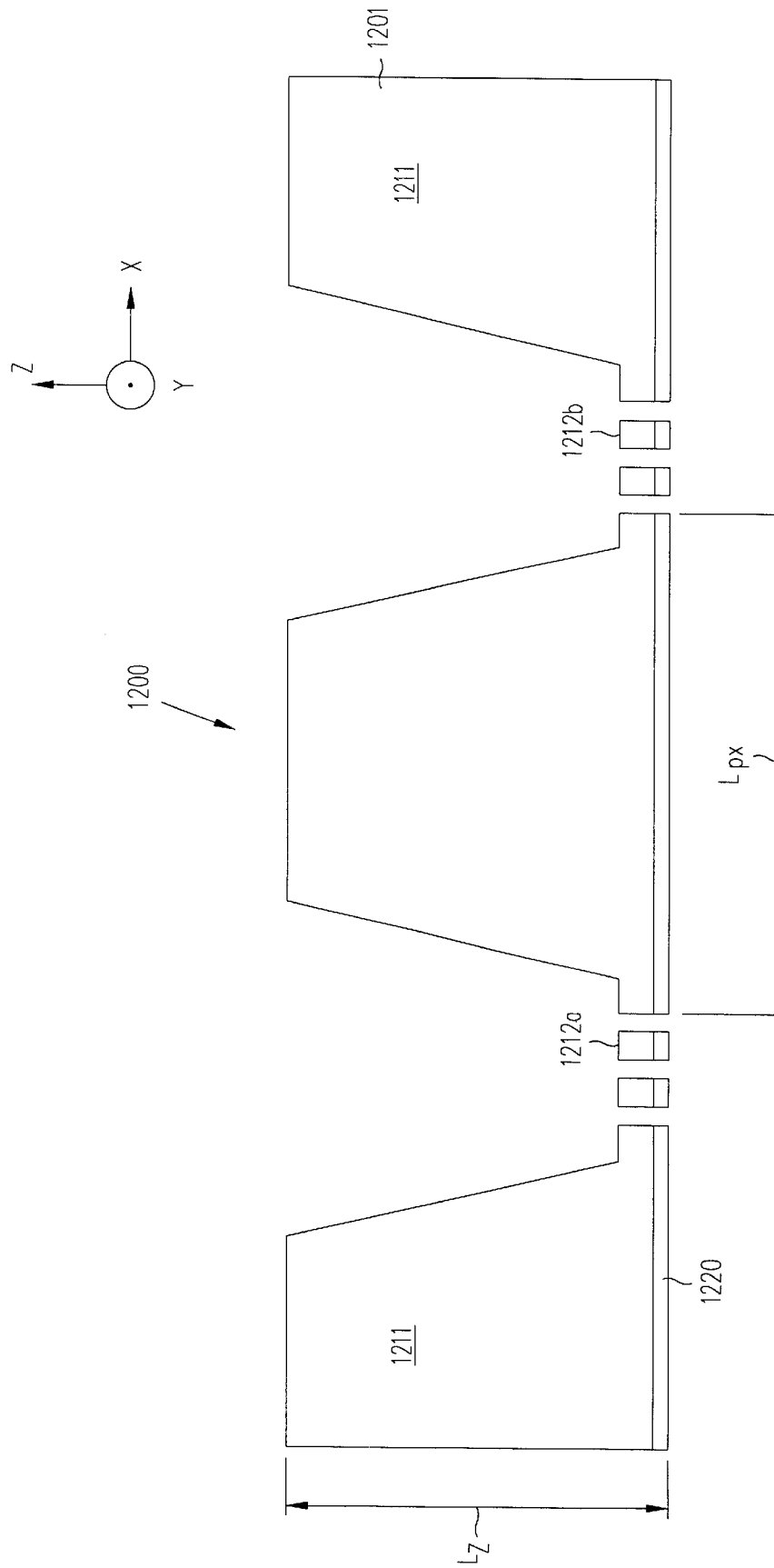
FIG. 13 is a cross sectional view of the upper structural member of FIG. 12 along section line 13—13 of FIG. 12.

FIG. 12 is a bottom view of an upper structural member 1200 in accordance with another embodiment of the invention. As described below, upper structural member 1200 is used to form a mechanical switch, rather than an electromagnetic sensor. FIG. 13 is a cross sectional view of upper structural member 1200 along section line 13—13 of FIG. 12. FIGS. 12 and 13 use the illustrated X-Y-Z coordinate system. Structural member 1200 includes a monocrystalline silicon structure 1201 that has a frame portion 1211, spring elements 1212a–1212d and platform portion 1213. Spring elements 1212a–1212d extend from frame 1211 to platform 1213 in a serpentine pattern. Spring elements 1212a–1212d provide compliance along the Z-axis. Thus, when frame 1211 is fixed and a force is applied to platform 1213 along the Z-axis, platform 1213 moves along the Z-axis at the ends of springs 1212a–1212d.

In a particular embodiment, silicon structure 1201 has a length, $L_x$, along the X-axis of approximately 1.5 mm, and a length, $L_y$, along the Y-axis of approximately 1 mm. In this embodiment, structure 1201 has a height, $L_z$, along the Z-axis of approximately 500 μm. Springs 1212a–1212d each have a width, $W_S$, of approximately 40 μm, and an effective length, $L_S$, of approximately 0.9 mm. Frame 1211 has a width, $W_F$, Of approximately 0.3 mm. Platform 1213 has a length, $L_{PX}$, along the X-axis of approximately 0.9 mm, and a length, $L_{PY}$ along the Y-axis of approximately 0.6 mm. These dimensions are illustrative and not limiting. Other dimensions are used in other embodiments of the invention.

A conductive layer 1220 is formed over the lower surface of upper structural member 1200. In one embodiment, conductive layer 1220 is a layer of electroplated, evaporated or sputtered gold (or platinum or some other metal) having a thickness of approximately 0.2 μm. As described in more detail below, conductive layer 1220 is used as a bridge contact pad of the resulting micro-switch. This bridge contact pad is positioned over contact pads located on a corresponding lower structural member. Conductive layer 1220 is substantially planar in the X-Y plane. Because conductive layer 1220 is a non-magnetic, electrically conductive material, layer 1220 advantageously conducts current without introducing a skin effect that can cause signal attenuation at high frequency.

Figure 14:
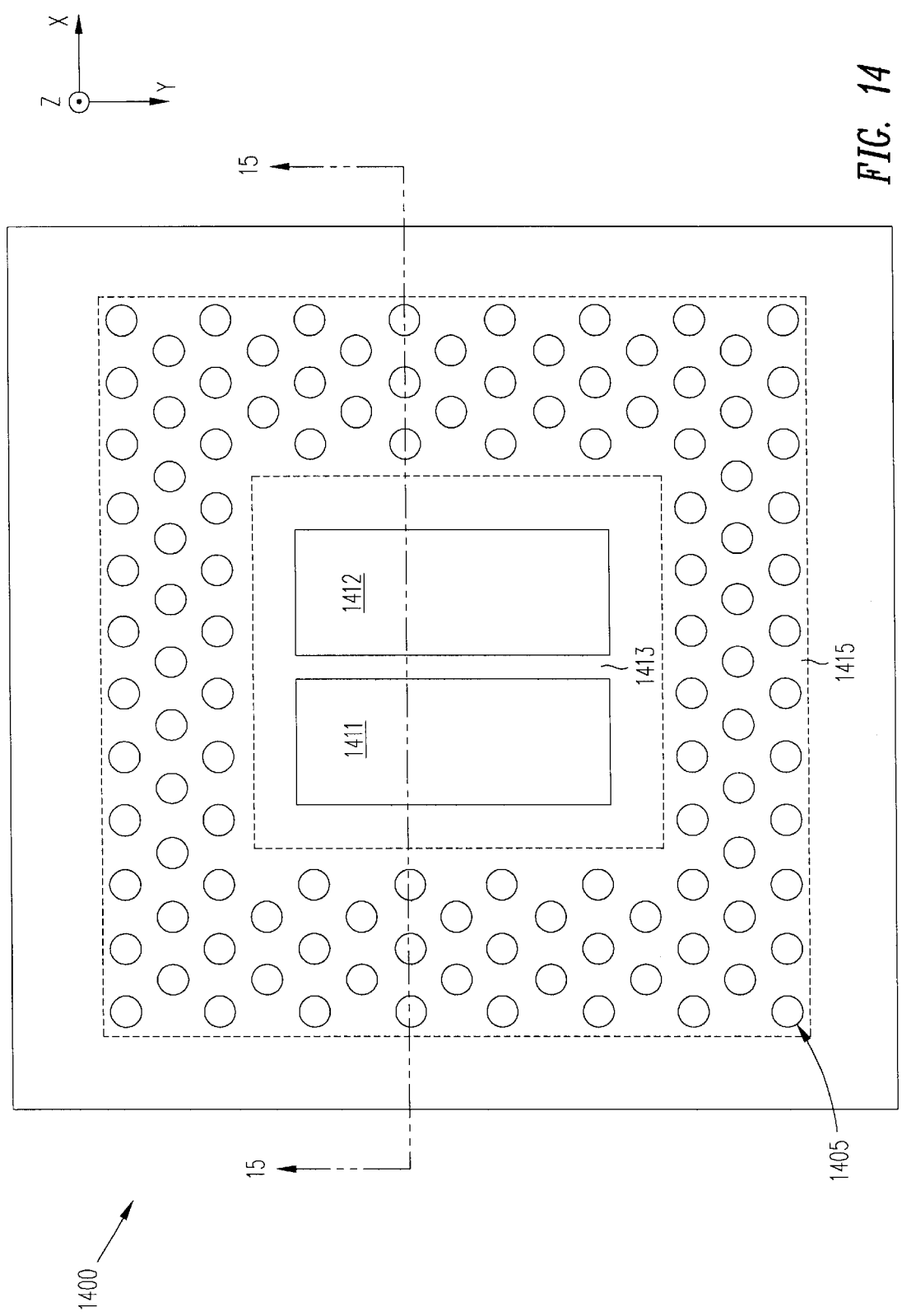
FIG. 14 is a top view of a lower structural member in accordance with an alternative embodiment of the present invention.
Figure 15:
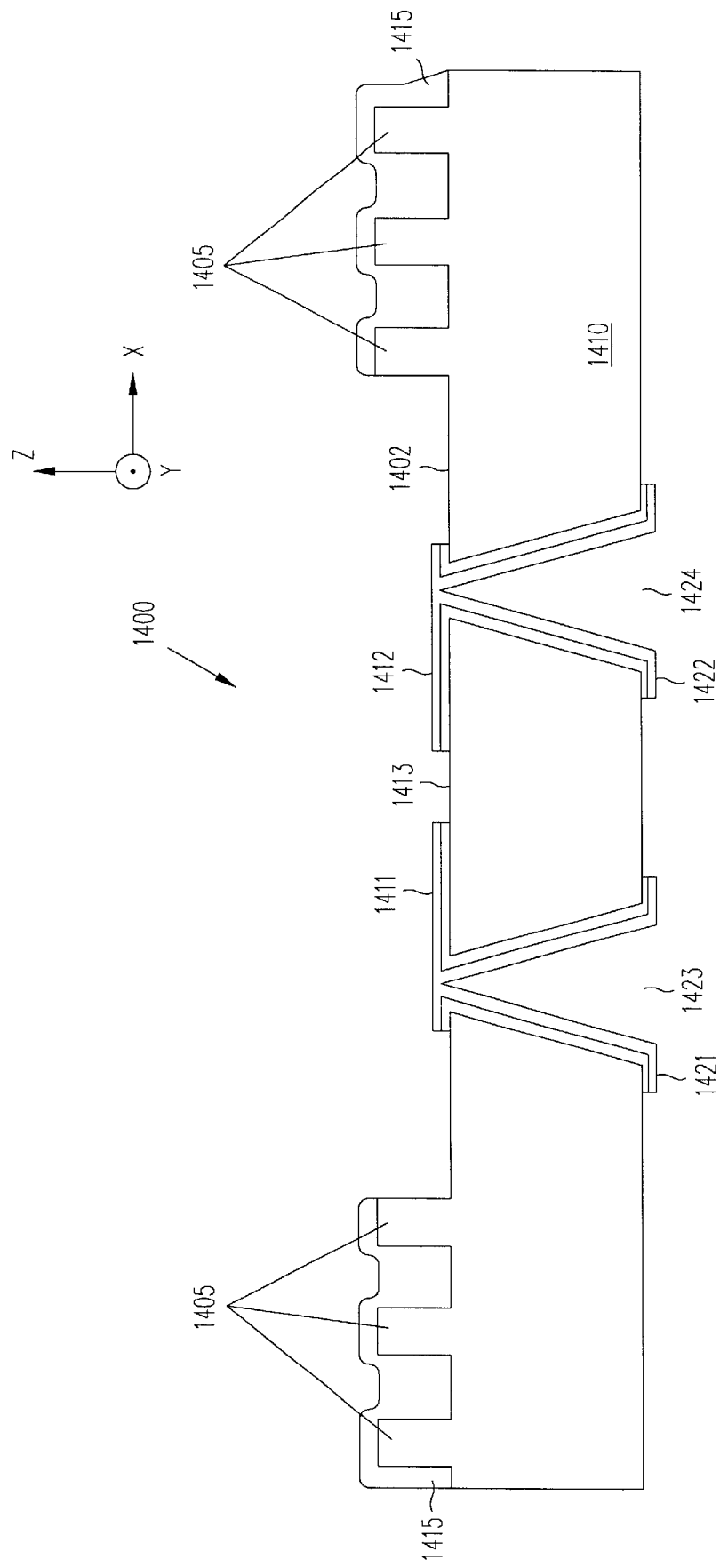
FIG. 15 is a cross sectional view of the lower structural member of FIG. 14 along section line 15—15 of FIG. 14.

FIG. 14 is a top view of lower structural member 1400. FIG. 15 is a cross sectional view of lower structural member 1400 along section line 15—15 of FIG. 14. FIGS. 14 and 15 use the same X-Y-Z coordinate system as FIGS. 12 and 13. As described in more detail below, upper structural member 1200 is connected to lower structural member 1400 to form a micro-switch 1300.

Lower structural member 1400 includes a substrate 1410 and electrically conductive contact pads 1411 and 1412 located on the upper surface 1402 of substrate 1410. In the described embodiment, substrate 1410 is a monocrystalline silicon substrate that is etched to form a pattern of raised spacer pads 1405. The pattern of raised spacer pads 1405 extends around the periphery of upper surface 1402 of substrate 1410, and laterally surrounds contact pads 1411 and 1412. Each of the spacer pads 1405 has a height along the Z-axis of approximately 4 microns. A connective material 1415, such as solder or tin-gold is formed between the pattern of spacer pads 1405.

Contact pads 1411 and 1412 are patterned such that a gap 1413 exists between these contact pads 1411–1412. As a result, contact pads 1411 and 1412 are normally electrically isolated from each other. In a particular embodiment, contact pads 1411 and 1412, which are typically gold, have a height along the Z-axis of approximately 2 μm. Vias 1423 and 1424 extend through substrate 1410. Electrically conductive traces 1421 and 1422 are located in vias 1423 and 1424, respectively. Traces 1421 and 1422 are connected to contact pads 1411 and 1412, respectively, as illustrated. Traces 1421 and 1422 enable the resulting micro-switch to be connected to external circuitry.

Figure 16:
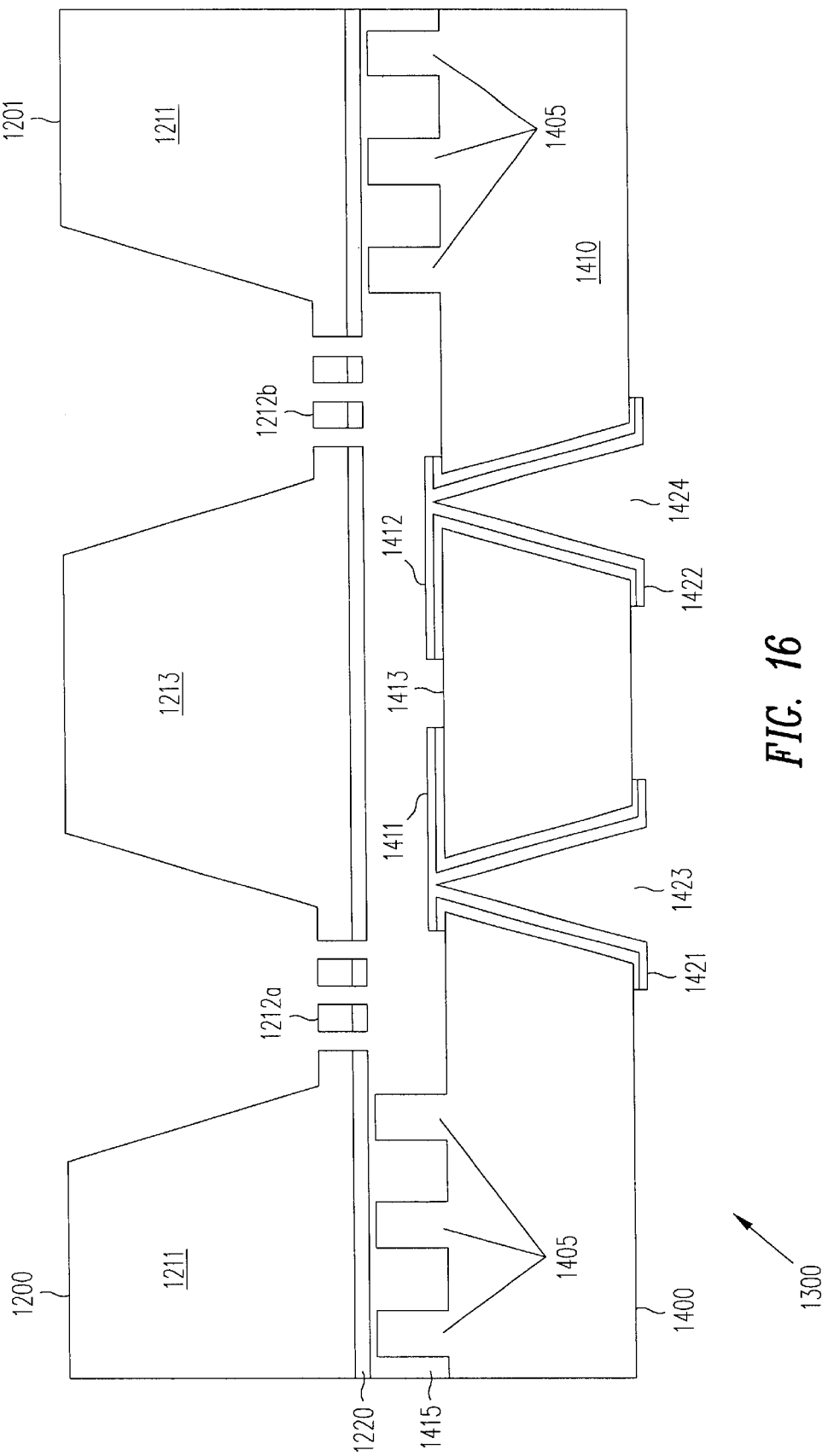
FIG. 16 is a cross sectional view of a micro-switch formed by joining the upper and lower structural members of FIGS. 13 and 15.

FIG. 16 is a cross sectional view illustrating micro-switch 1300 which is formed by connecting upper structural member 1200 and lower structural member 1400. Connective material 1415 forms a eutectic bond between the upper structural member 1200 and the lower structural member 1400. The connective material 1415 is located between the spacer pads 1405. As a result, the height of spacer pads 1405 defines the gap which exists between conductive layer 1220 on the upper structural member 1200 and the contact pads 1411 and 1412 on the lower structural member 1400. In the described embodiment, this gap has a height along the Z-axis of approximately 2 microns.

Micro-switch 1300 operates as follows. When no external forces are applied to micro-switch 1300, micro-switch switch 1300 remains in the position illustrated in FIG. 16. That is, conductive layer 1220 is separated from contact pads 1411 and 1412. As a result, no current flows between contact pads 1411 and 1412.

When an external force is applied to micro-switch 1300 along the positive Z-axis, platform 1213 is thrown in the negative Z-direction until conductive layer 1220 touches both of contact pads 1411 and 1412, thereby providing an electrical path between elements 1411 and 1412 across gap 1413 (i.e., springs 1212a–1212d and platform 1213 are forced downward along the Z-axis, out of the plane of frame 1211). At this point, micro-switch 1300 is closed and current is free to flow between elements 1411 and 1412. When the external force subsides, spring elements 1212a–1212d pull platform 1213 back to the open position illustrated in FIG. 16.

Figure 17:
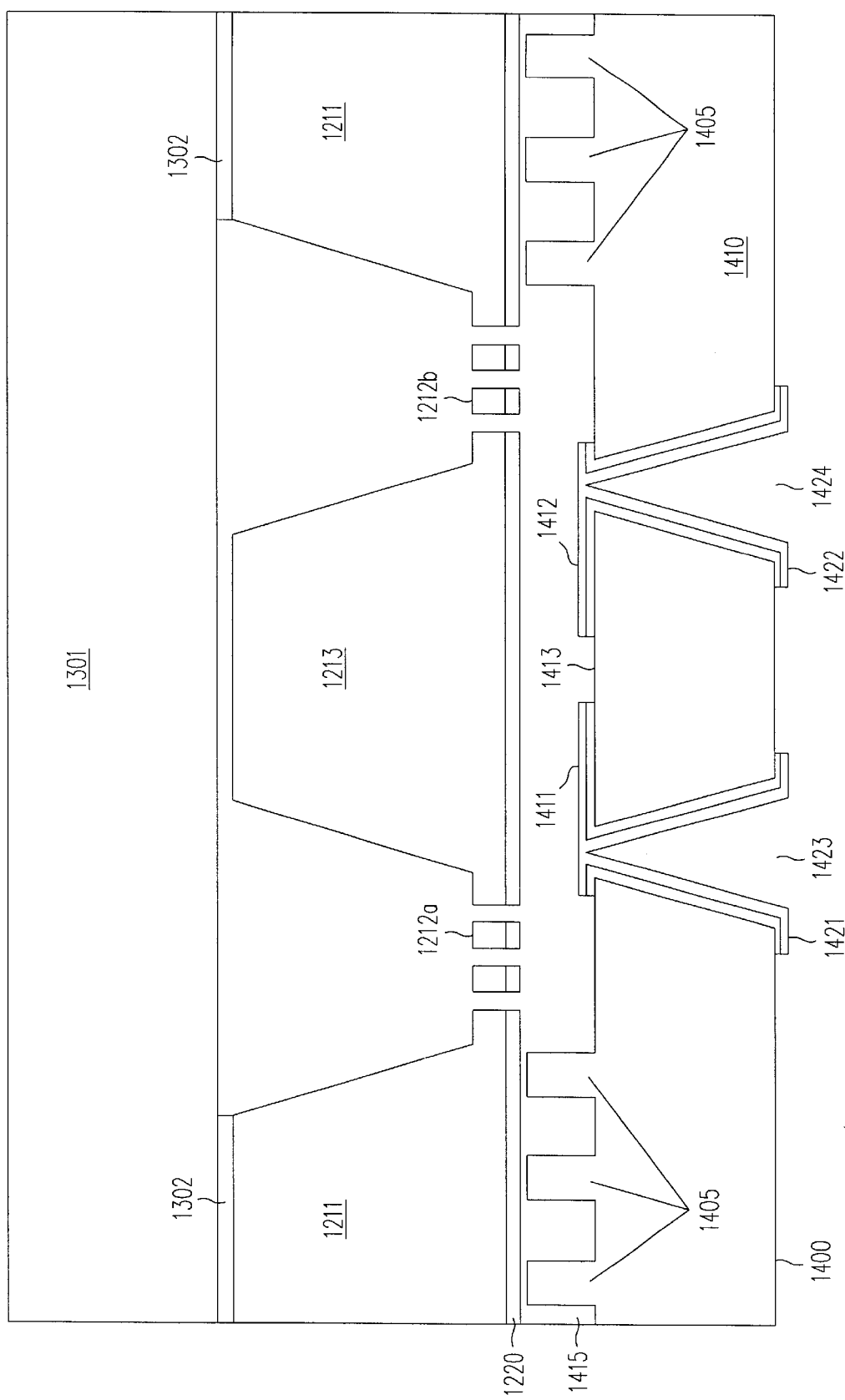
FIG. 17 is a cross sectional view of the micro-switch of FIG. 16 with a cover substrate attached to the upper structural member.

FIG. 17 illustrates micro-switch 1300 after a cover substrate 1301 has been mounted over upper structural member 1200. Cover substrate 1301 can be, for example, monocrystalline silicon. Cover substrate 1301 is mounted on upper structural member 1200 with a connective material 1302 (e.g., solder or tin-gold) having a, predetermined thickness. The thickness of connective material 1302 is selected to provide clearance between platform 1213 and cover substrate 1301. Cover substrate 1301 helps to maintain a clean environment within micro-switch 1300, as well as limiting the upward movement of platform 1213. In an alternative embodiment, a bridge contact pad is formed over the upper surface of platform 1213, and associated contact pads are formed over the lower surface of cover substrate 1301, such that the bridge contact pad forms a closed circuit between the contact pads on the cover substrate 1301 when there is excessive movement of the platform 1213 in the positive Z direction.

The external force required to actuate micro-switch 1300 has a magnitude of approximately 2 to 4 g's in the described embodiment. The value of the actuating force can be modified by changing the dimensions of the spring elements 1212a–1212d and the thickness of substrate 1201. In general, the stiffness of the spring elements is inversely proportional to the third power of the thickness of the spring elements. The switch elements 1212a–1212d provide for fast switching times and prevents arcing during transitions between the closed and open states of micro-switch 1300.

As previously described in connection with micro-switch 1, the single crystal structure of monocrystalline structure 1201 provides mechanical advantages, such as superior stiffness, durability, fatigue and deformation characteristics.

Figure 18A:
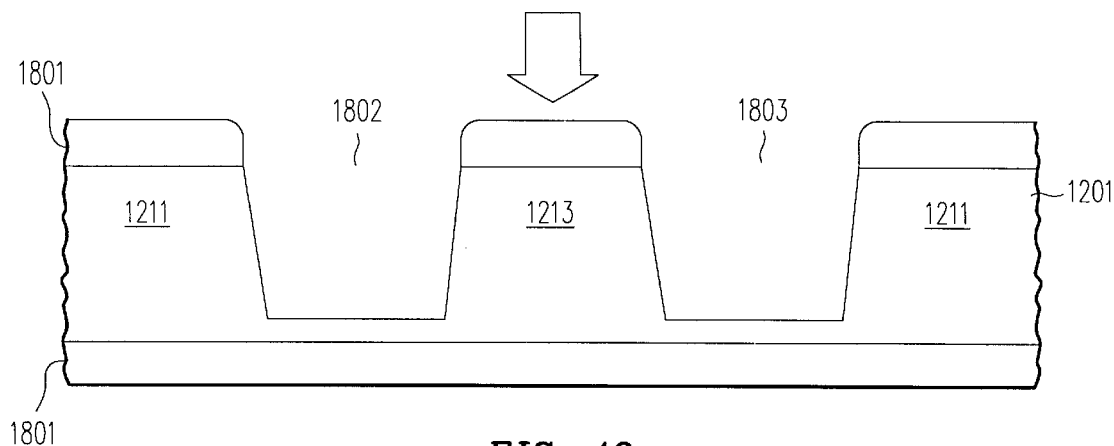
FIGS. 18a–18c are cross sectional views illustrating method steps used to form the upper structural member of FIGS. 12 and 13.
Figure 18B:
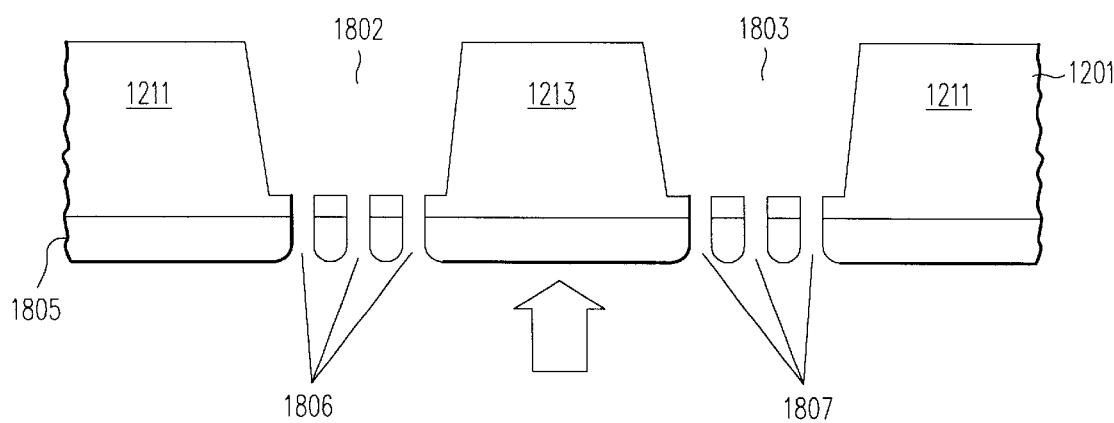
Figure 18C:
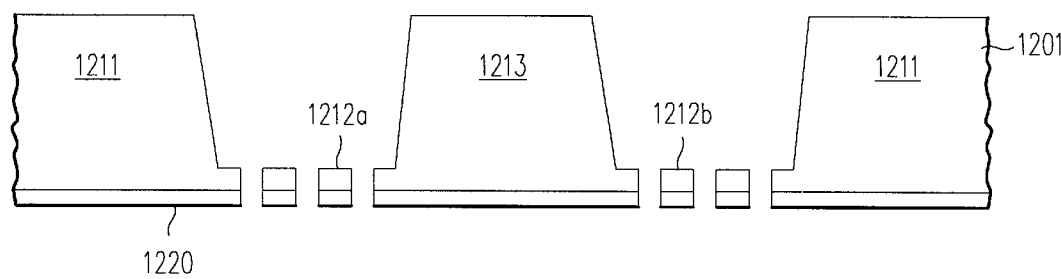

The fabrication of structural members 1200 and 1400 will now be described in detail. FIGS. 18a–18c illustrate the fabrication of upper structural member 1200 in accordance with one embodiment of the invention. Upper structural member 1200 is formed from a monocrystalline silicon wafer 1211 having a <100>crystalline structure. In the illustrated embodiment, monocrystalline structure 1211 has a thickness in the range of 500 µm. Other monocrystalline semiconductor materials can also be used.

As illustrated in FIG. 18a, a first photoresist mask 1801 is formed over monocrystalline structure 1211, and the resulting structure is etched from the top with KOH to form cavities 1802 and 1803 as illustrated. Cavities 1802 and 1803 define frame 1211 and platform 1213. The remaining thickness of structure 1201 at the bottom of cavities 1802 and 1803 is controlled to be approximately 6 microns. The etching step is controlled using any of the alternatives previously described in connection with FIGS. 6a–6c.

The first mask 1801 is then stripped and a photoresist layer 1805 is formed over the lower surface of substrate 1201. Openings 1806 and 1807 are formed in photoresist layer 1805. These openings define spring elements 1212a–1212d. An anisotropic-reactive ion etch (RIE) of monocrystalline structure 1201 is performed through openings 1806 and 1807, thereby forming spring elements 1212a–1212d and releasing platform 1213. In the previously described steps, instead of photoresist, other masking material can be used including oxide, chrome aluminum and nickel.

The photoresist layer 1805 is then stripped and a conductive layer 1220 is deposited onto the lower surface of the resulting structure. The conductive layer 1220 can be deposited, for example, by evaporation or sputtering. The conductive layer 1220 can be, for example, a metal such as chrome/gold. In one embodiment, metal layer 1220 has a thickness of approximately 2 µm. In one variation, the conductive layer 1220 can be formed prior to the formation of photoresist mask 1805 and the etching of spring elements 1212a–1212d.

Figure 19A:
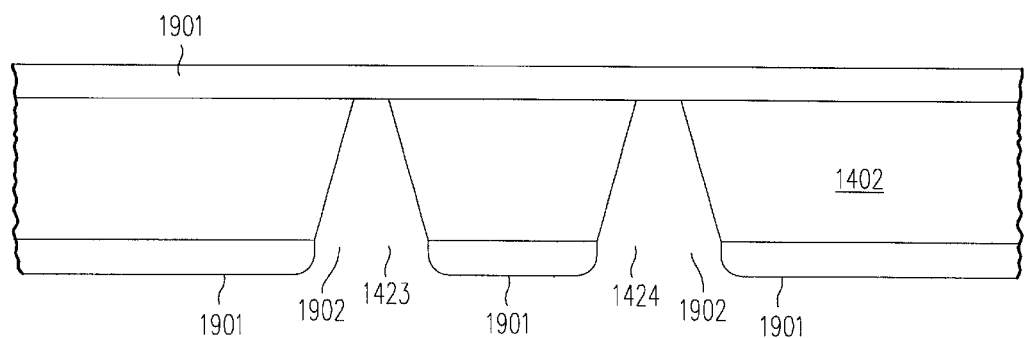
FIGS. 19a–19h are cross sectional views illustrating method steps used to form the lower structural member of FIGS. 14 and 15.

FIGS. 19a–19h are cross sectional views of the lower structural member 1400 during selected processing steps. Initially, monocrystalline silicon substrate 1402 is cleaned. Then, as illustrated in FIG. 19a, the substrate 1402 is thermally oxidized such that a layer of oxide 1901 having a thickness of approximately 1 µm is grown on the external surfaces of the substrate 1402. A first photoresist mask (not shown) is patterned on the oxide layer 1901 at the lower surface of the substrate 1402. The first photoresist mask includes a number of rectangular openings that define the locations of vias 1423 and 1424. The portions of the oxide layer 1901 which are exposed through the openings in the photoresist mask are removed such that there are a number of openings 1902 formed in oxide layer 1901 at the bottom surface of the silicon substrate 1402. The substrate 1402 is then etched from its backside using KOH that attacks the silicon through openings 1902. The backside etch continues until vias 1423 and 1424 extend through the substrate 1402.

Figure 19B:
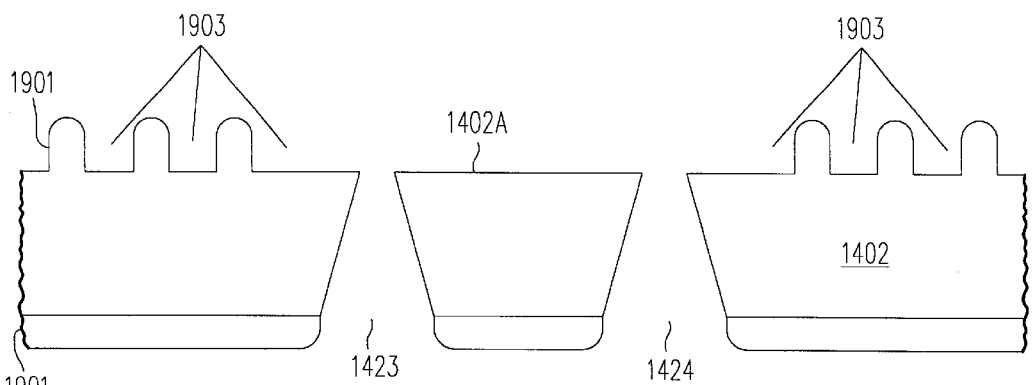
Figure 19C:
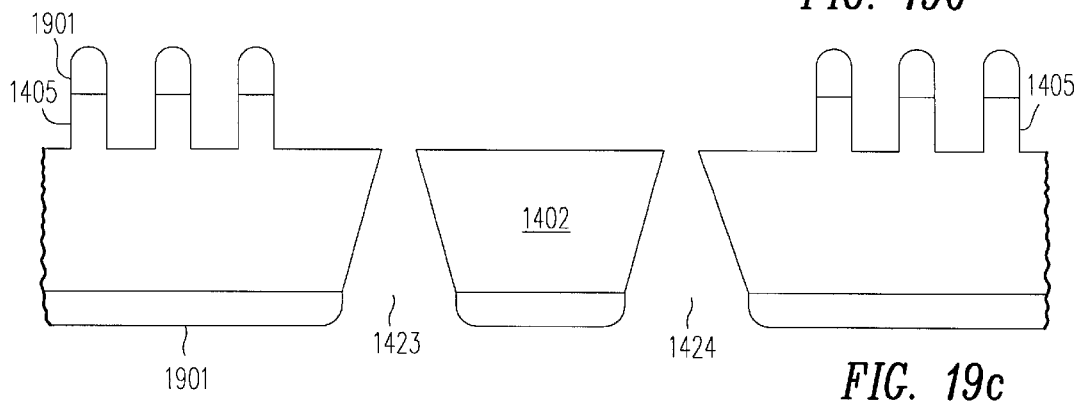
Figure 19D:
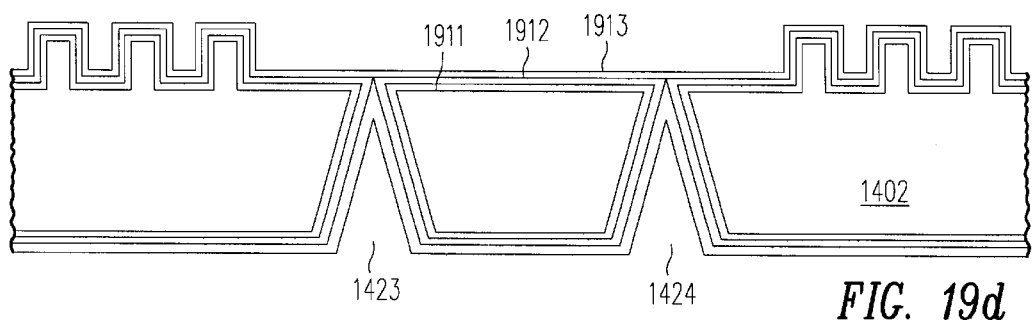

A second photoresist mask (not shown) is then patterned on the oxide layer 1901 at the upper surface of the substrate 1402. The second photoresist mask has a pattern that defines the locations of spacer pads 1405. The portions of the oxide layer 1901 which are exposed by the second photoresist mask are removed such that there are a number of openings 1903 formed in oxide layer 1901 at the upper surface 1402A of the silicon substrate 1402 (FIG. 19b). The substrate 1402 is then plasma etched to a depth of approximately 2 microns, thereby forming spacer pads 1405 as illustrated in FIG. 19c.

The first oxide layer 1901 is then completely stripped and re-oxidized to form an insulation layer. A first layer of titanium 1911 having a thickness of approximately 200 Angstroms is sputtered over the entire outer surface of the resulting structure. A layer of gold 1912 having a thickness of approximately 0.3 microns is sputtered over the layer of titanium 1911. A second layer of titanium 1913 having a thickness of about 200 Angtroms is sputtered over the layer of gold 1912. In other embodiments, the metal layers 1911–1913 can be made from other metals or metal alloys. In yet other embodiments, one or more of the electrically conductive layers 1911–1912 can be replaced with a conductive layer formed by selective doping of the substrate.

Figure 19E:
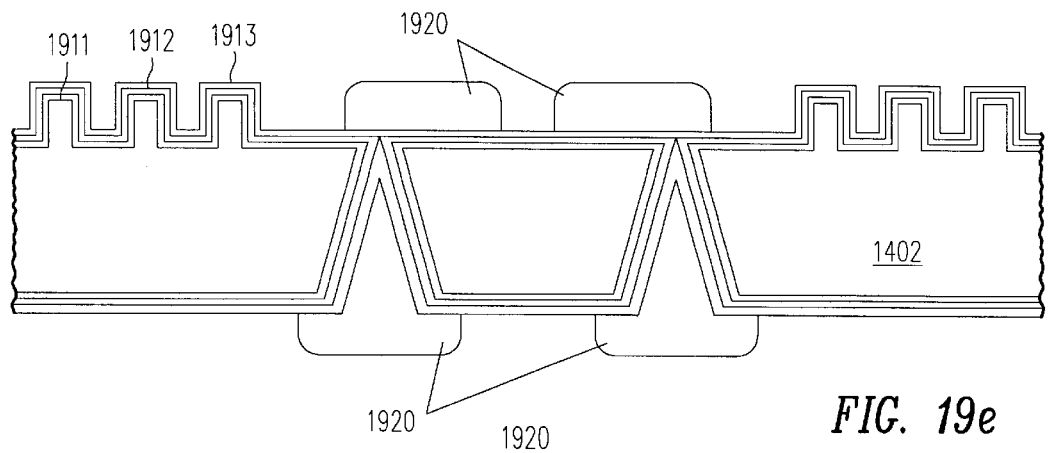
Figure 19F:
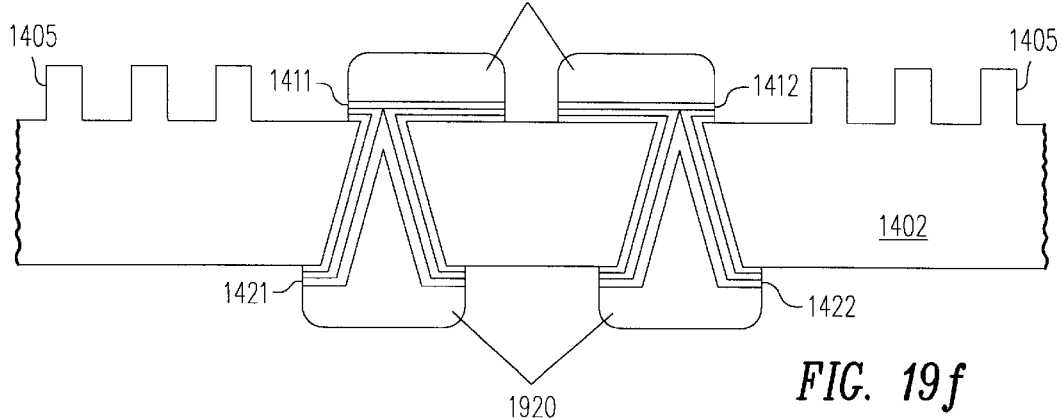

As illustrated in FIG. 19e, a photoresist mask 1920 is formed over the upper and lower surfaces of the resulting structure to define contact pads 1411 and 1412, as well as conductive traces 1421 and 1422. The combined metal layer formed by layers 1911–1913 is then etched through mask 1920; thereby forming contact pads 1411–1412 and conductive traces 1421–1422 as illustrated in FIG. 19f.

Figure 19G:
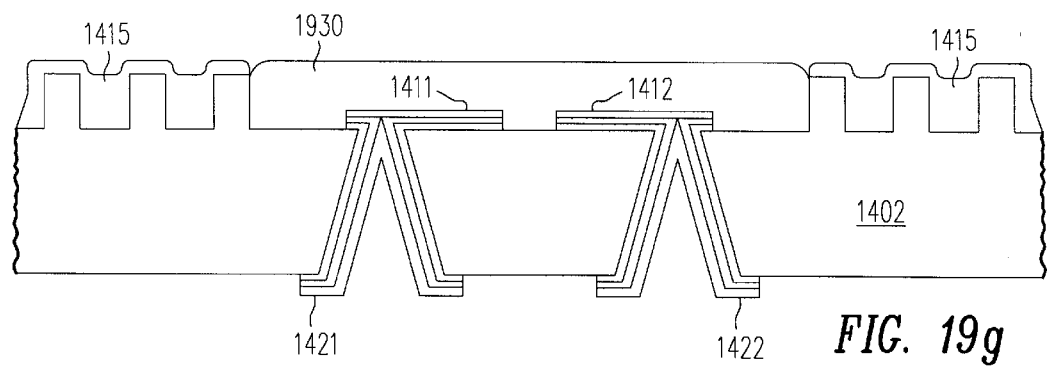

The mask 1920 is then stripped, and another mask 1930 is formed over the upper surface of the resulting structure. Mask 1930 is formed within the region that is encircled by spacer pads 1405. Connective material 1415 is the formed over the resulting structure. Connective material 1415 can be formed, for example, by electroplating solder or by evaporating tin-gold. Mask 1930 and connective material 1415 are illustrated in FIG. 19g.

Figure 19H:
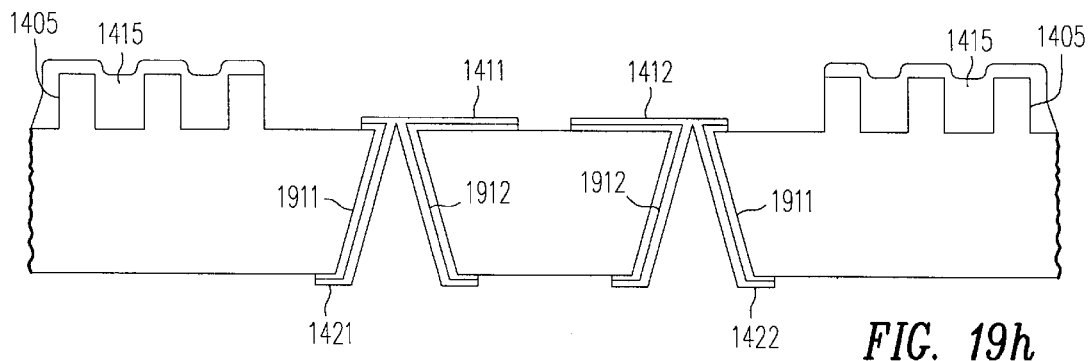

As illustrated in FIG. 19h, mask 1930 is stripped. The second layer of titanium 1913 is subsequently stripped, thereby exposing the layer of gold 1912 and completing the fabrication of the lower structural member 1400. Stripping the second layer of titanium 1913 after the connective material 1415 has been deposited prevents the layer of gold 1912 from being contaminated with the connective material. That is, the second layer of titanium 1913 can be used to cover (protect) the layer of gold 1912 until immediately prior to connecting the lower structural member 1400 to the upper structural member 1200.

The previously described micro-switches can be modified in various ways. For example, although the fabrication of a single micro-relay has been described, it is understood that the methods described herein facilitate the batch fabrication of a plurality of micro-relays. That is, a plurality of upper structural members 100 (or 1200) can be simultaneously fabricated on a silicon wafer, a plurality of lower structural members 200 (or 1400) can be simultaneously fabricated on a single substrate, and the silicon wafer can be joined to the single substrate to form a plurality of micro-switches. This plurality of micro-switches can be diced into individual switches, or maintained as an integrated array of switches. Such an integrated array of switches can be used to provide redundancy to a particular switching scheme.

In other variations, other numbers of contact pads are used. Although the embodiments of FIGS. 5a and 16 use two contact pads (211–212, 1411–1412) additional contact pads can be added. Furthermore, other numbers of coils and pole pieces can be used in micro-sensor 1.

In addition, although the connections to contact pads 1411 and 1412 have been illustrated as extending through substrate 1402 (FIG. 15), it is understood that these connections can also be brought out on the upper surface of substrate 1402. FIG. 20 is a top view of a lower structural member 2000 in accordance with such an embodiment. In lower structural member 2000, spacer pads 2005 are formed in the same manner previously described in connection with lower structural member 1400 (FIGS. 19a–19h). Traces 2011 and 2012 are formed on the upper surface of the lower structural member 2000 as illustrated. Traces 2011 and 2012 include contact pads 2011A and 2012A (which are located inside of the pattern of spacer pads 2005); bonding pads 2011B and 2012B (which are located outside of the pattern of spacer pads 2005), and conductive pathways 2011C and 2012C (which connect contact pads 2011A and 2012A with bonding pads 2011C and 2012C, respectively). Note that the pattern of connective material 2015 is positioned so as not to contact the traces 2011–2012. In one embodiment, the corresponding upper structural member is sized to fit over the pattern of spacer pads 2005, but leave pads 2011B and 2012B exposed, thereby enabling external electrical contact to be made to these pads.

Figure 21:
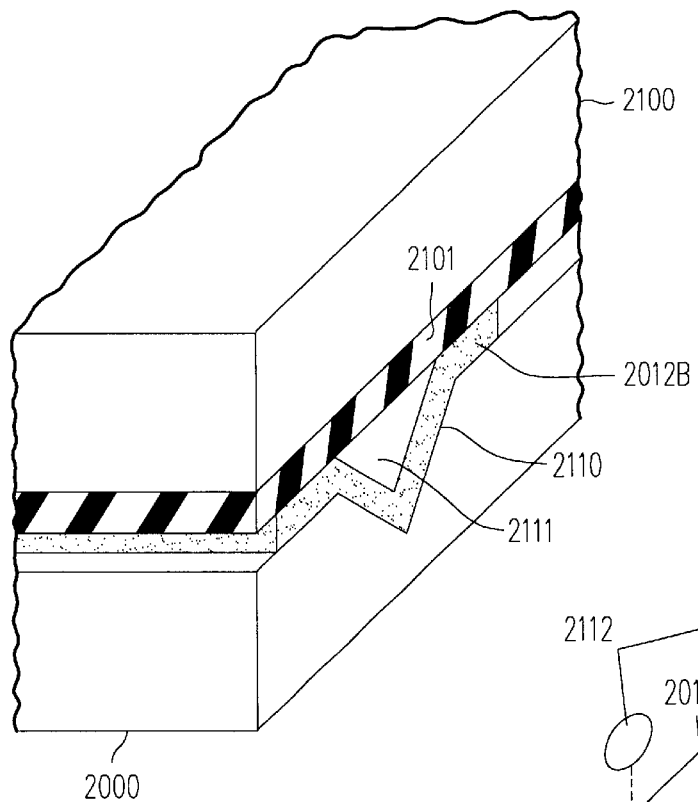
FIG. 21 is an isometric view illustrating a bonding pad area of the lower structural member of FIG. 20 as attached to a corresponding upper structural member.

FIG. 21 illustrates another manner of connecting the lower structural member 2000 of FIG. 20 to a corresponding upper structural member 2100. In this embodiment, bonding pad 2012B is deposited over a groove 2110 formed on the upper surface of the lower structural member 2000. A thin insulating layer 2101 is formed on the lower surface of the upper structural member 2100 where the upper structural member 2100 overlies bonding pad 2012B. As a result, bonding pad 2012B is electrically insulated from the upper structural member 2100. A cavity 2111 is formed between bonding pad 2110 and the insulating layer 2101 as illustrated.

Figure 22:
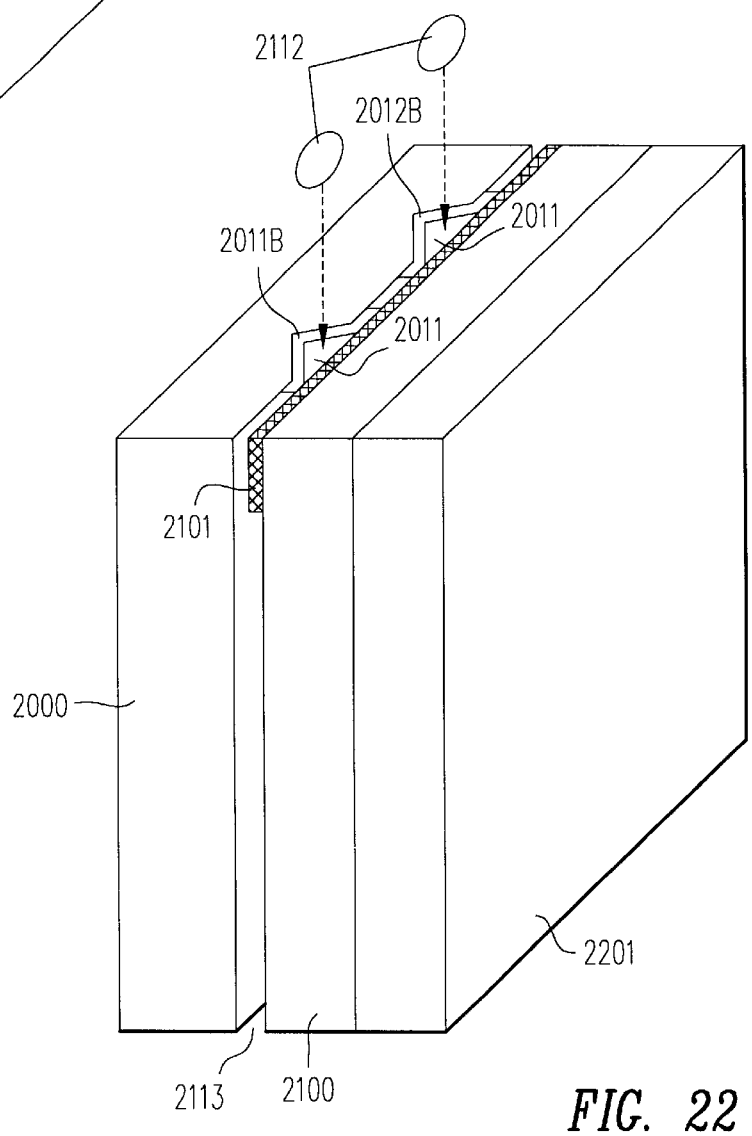
FIG. 22 is an isometric view of a vertically mountable micro-switch in accordance with another embodiment of the present invention.

FIG. 22 is an isometric view of a micro-switch 2200 which includes lower structural member 2000, upper structural member 2100 and cover substrate 2201. Cavities 2111, which expose bonding pads 2011B and 2012B, are located at the same surface of micro-switch 2200. Conventional solder balls 2112 can be placed in cavities 2111, thereby providing an electrical connection to bonding pads 2011B and 2012B. The resulting structure can then be vertically mounted on a printed circuit board, with solder balls 2112 providing the physical and electrical connection to the printed circuit board. In this embodiment, the plane of motion of the platform within micro-switch 2200 is perpendicular to the plane of the printed circuit board. Note that the spacing 2113 between lower structural member 2000 and upper structural member 2100 is controlled by the spacer pads, which are not visible in FIG. 22.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A micro-sensor comprising:
   a substrate;
   one or more planar coils located entirely over a single surface of the substrate;
   a flexible monocrystalline structure suspended over the substrate; and
   one or more pole tips coupled to the monocrystalline structure and positioned above the one or more coils, wherein an external force applied to the flexible monocrystalline structure causes the monocrystalline structure to flex toward the substrate, thereby inserting the pole tips into the planar coils to induce a voltage in the planar coils or change the inductance of the planar coils.

2. The micro-sensor of claim 1, wherein the monocrystalline structure comprises:
   a frame portion located about a perimeter of the monocrystalline structure;
   a platform portion which is laterally surrounded by the frame portion, the pole piece being located on the platform portion; and
   a plurality of spring elements extending between the frame portion and the platform portion.

3. The micro-sensor of claim 2, wherein the spring elements have a serpentine shape.

4. The micro-sensor of claim 2, further comprising a cover located over the monocrystalline structure.

5. The micro-sensor of claim 1, wherein the monocrystalline structure is continuous.

6. The micro-sensor of claim 2, wherein the spring elements have a thickness that is less than the thickness of the frame portion and the platform portion.

7. The micro-sensor of claim 1, wherein the substrate comprises a ferromagnetic material.

8. The micro-sensor of claim 1, wherein the substrate comprises:
   a monocrystalline silicon substrate having a trench located therein; and
   a layer of ferromagnetic material located in the trench.

9. The micro-sensor of claim 1, wherein the pole tips comprise a ferromagnetic material.

10. The micro-sensor of claim 1, wherein the pole tips comprise a permanent magnetic material.

11. The micro-sensor of claim 1, wherein the monocrystalline structure comprises monocrystalline silicon.

12. A micro-switch comprising:
    a substrate;
    a plurality of spacer pads located at the upper surface of the substrate and surrounding a central area of a substrate;
    a plurality of electrically conductive contact pads located at the central area of the upper surface of the substrate, wherein the contact pads are laterally surrounded by the spacer pads;
    a flexible monocrystalline structure mounted on the spacer pads and suspended over the contact pads; and
    an electrically conductive bridge contact pad located on a lower surface of the monocrystalline structure, the bridge contact pad being positioned such that when the monocrystalline structure flexes toward the substrate, the bridge contact pad touches two or more of the contact pads, thereby providing an electrical connection between the two or more contact pads.

13. The micro-switch of claim 12, wherein the monocrystalline structure comprises monocrystalline silicon.

14. The micro-switch of claim 12, wherein the monocrystalline structure comprises:
   frame portion located about a perimeter of the monocrystalline structure;
   a platform portion which is laterally surrounded by the frame portion, the pole piece being located on the platform portion; and
   a plurality of spring elements extending between the frame portion and the platform portion.

15. The micro-switch of claim 12, further comprising a cover substrate mounted over the upper surface of the monocrystalline structure.

16. The micro-switch of claim 12, further comprising:
   a plurality of bonding pads located near an edge of the upper surface of the substrate, wherein each of the bonding pads is electrically connected to a corresponding one of the contact pads, and wherein each of the bonding pads is located in a groove;
   an insulating layer located between the bonding pads and the lower surface of the monocrystalline structure; and
   a solder ball located in each of the grooves, thereby providing an electrical connection to the bonding pads.

* * * * *